United States Patent
Aiba et al.

(10) Patent No.: US 9,509,441 B2
(45) Date of Patent: *Nov. 29, 2016

(54) MOBILE STATION APPARATUS, PROCESSING METHOD, AND INTEGRATED CIRCUIT

(71) Applicant: SHARP KABUSHIKI KAISHA, Osaka (JP)

(72) Inventors: Tatsushi Aiba, Osaka (JP); Shoichi Suzuki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/885,354

(22) Filed: Oct. 16, 2015

(65) Prior Publication Data

US 2016/0036559 A1  Feb. 4, 2016

Related U.S. Application Data

(63) Continuation of application No. 13/881,994, filed as application No. PCT/JP2011/074496 on Oct. 25, 2011, now Pat. No. 9,197,359.

(30) Foreign Application Priority Data

Oct. 29, 2010 (JP) .................................. 2010-243179

(51) Int. Cl.
*H04W 4/00* (2009.01)
*H04B 7/212* (2006.01)
(Continued)

(52) U.S. Cl.
CPC ............ *H04L 1/001* (2013.01); *H03M 13/136* (2013.01); *H03M 13/35* (2013.01);
(Continued)

(58) Field of Classification Search
CPC ........................................................ H04L 1/001
See application file for complete search history.

(56) References Cited

U.S. PATENT DOCUMENTS

| 2005/0157687 A1* | 7/2005 | Heo ...................... H04L 1/0006 370/335 |
| 2007/0079207 A1* | 4/2007 | Seidel ................... H04L 1/1845 714/748 |

(Continued)

FOREIGN PATENT DOCUMENTS

| CN | 101202606 A | 6/2008 |
| CN | 101867467 A | 10/2010 |

OTHER PUBLICATIONS

3GPP TSG RAN WG1 Meeting #62,R1-104431, "ULACK/NAK Feedback in LTE-A TDD", Nokia, Nokia Siemens Networks, Agenda item: 6.2.2.1, Aug. 23-27, 2010.

(Continued)

*Primary Examiner* — Gerald Smarth
(74) *Attorney, Agent, or Firm* — Birch, Stewart, Kolasch & Birch, LLP

(57) ABSTRACT

A mobile station apparatus transmits in a subframe, to a base station apparatus, Hybrid Automatic Repeat Request (HARQ) control information and channel state information on the indicated one physical uplink control channel resource, the HARQ control information and the channel state information being transmitted using one of a first processing method of coding and a second processing method of coding, the one of the first processing method of coding and the second processing method of coding being applied on the basis of whether a sum of a number of bits of the HARQ control information and a number of bits of the channel state information exceeds a second predetermined value.

6 Claims, 10 Drawing Sheets

(51) Int. Cl.

| | |
|---|---|
| *H04L 1/00* | (2006.01) |
| *H03M 13/13* | (2006.01) |
| *H03M 13/35* | (2006.01) |
| *H03M 13/00* | (2006.01) |
| *H04L 1/16* | (2006.01) |
| *H04L 1/18* | (2006.01) |
| *H04L 5/00* | (2006.01) |
| *H04L 1/06* | (2006.01) |
| *H04W 88/02* | (2009.01) |
| *H04W 88/08* | (2009.01) |

(52) U.S. Cl.
CPC ... *H03M 13/6306* (2013.01); *H03M 13/6356* (2013.01); *H03M 13/6362* (2013.01); *H03M 13/6525* (2013.01); *H04L 1/0057* (2013.01); *H04L 1/0067* (2013.01); *H04L 1/0073* (2013.01); *H04L 1/1607* (2013.01); *H04L 1/1812* (2013.01); *H04L 5/0055* (2013.01); *H04L 1/06* (2013.01); *H04W 88/02* (2013.01); *H04W 88/08* (2013.01)

(56) References Cited

U.S. PATENT DOCUMENTS

| | | | |
|---|---|---|---|
| 2009/0180433 A1* | 7/2009 | Ahn | H04W 52/54 370/329 |
| 2009/0274100 A1 | 11/2009 | Montojo et al. | |
| 2010/0118805 A1* | 5/2010 | Ishii | H04W 52/367 370/329 |
| 2010/0135272 A1 | 6/2010 | Dayal et al. | |
| 2011/0047430 A1* | 2/2011 | Feuersanger | H04L 1/1812 714/748 |
| 2011/0205981 A1 | 8/2011 | Koo et al. | |
| 2011/0243066 A1 | 10/2011 | Nazar et al. | |
| 2011/0249601 A1* | 10/2011 | Seo | H04L 1/0003 370/310 |
| 2011/0268090 A1 | 11/2011 | Qu et al. | |
| 2012/0084618 A1 | 4/2012 | Choudhury et al. | |

OTHER PUBLICATIONS

3GPP TSG RAN WG1 meeting #62bis, R1-105247, "A/N coding schemes for large payload using DFT-S-OFDM", Huawei, HiSilicon, Agenda Item: 6.2.1.1, Oct. 11-15, 2010.
3GPP TSG RAN WG1 Meeting #62bis,R1-105246, "ACK/NACK transmission schemes for TDD in LTE-A", Huawei, HiSilicon, Agenda Item: 6.2.1.1, Oct. 11-15, 2010.
3GPPTR36.814V9.0.0, "3rd Generation Partnership Project; Technical Specification Group Radio Access Network; Evolved Universal Terrestrial Radio Access (E-UTRA); Further advancements for E-UTRA physical layer aspects (Release9)", Mar. 2010.
CMCC et al., "Way Forward on Supporting ACK/NAK Payload Larger than 11 Bits in Rel-10 TDD", 3GPP TSG-RAN WG1 Meeting #62bis, Xi'an, China, R1-105776, Oct. 11-15, 2010, 2 pages.
Ericsson et al., "On ACK/NACK codebook performance for carrier aggregation", 3GPP TSG-RAN WG1 #62, R1-104840, Madrid, Spain, Aug. 23-27, 2010, 10 pages, XP-50450020.
International Search Report, mailed Nov. 29, 2011, issued in PCT/JP2011/074496.
Notice of Allowance in U.S. Appl. No. 13/881,994 mailed Jul. 17, 2015.
Office Action for U.S. Appl. No. 13/881,994 dated Mar. 26, 2015.
TSG-RAN WG1 #53bis, R1-082468, "Carrier aggregation in LTE-Advanced", Ericsson, Agenda Item: 12, Jun. 30-Jul. 4, 2008.

* cited by examiner

FIG.6

| i | Mi,0 | Mi,1 | Mi,2 | Mi,3 | Mi,4 | Mi,5 | Mi,6 | Mi,7 | Mi,8 | Mi,9 | Mi,10 |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

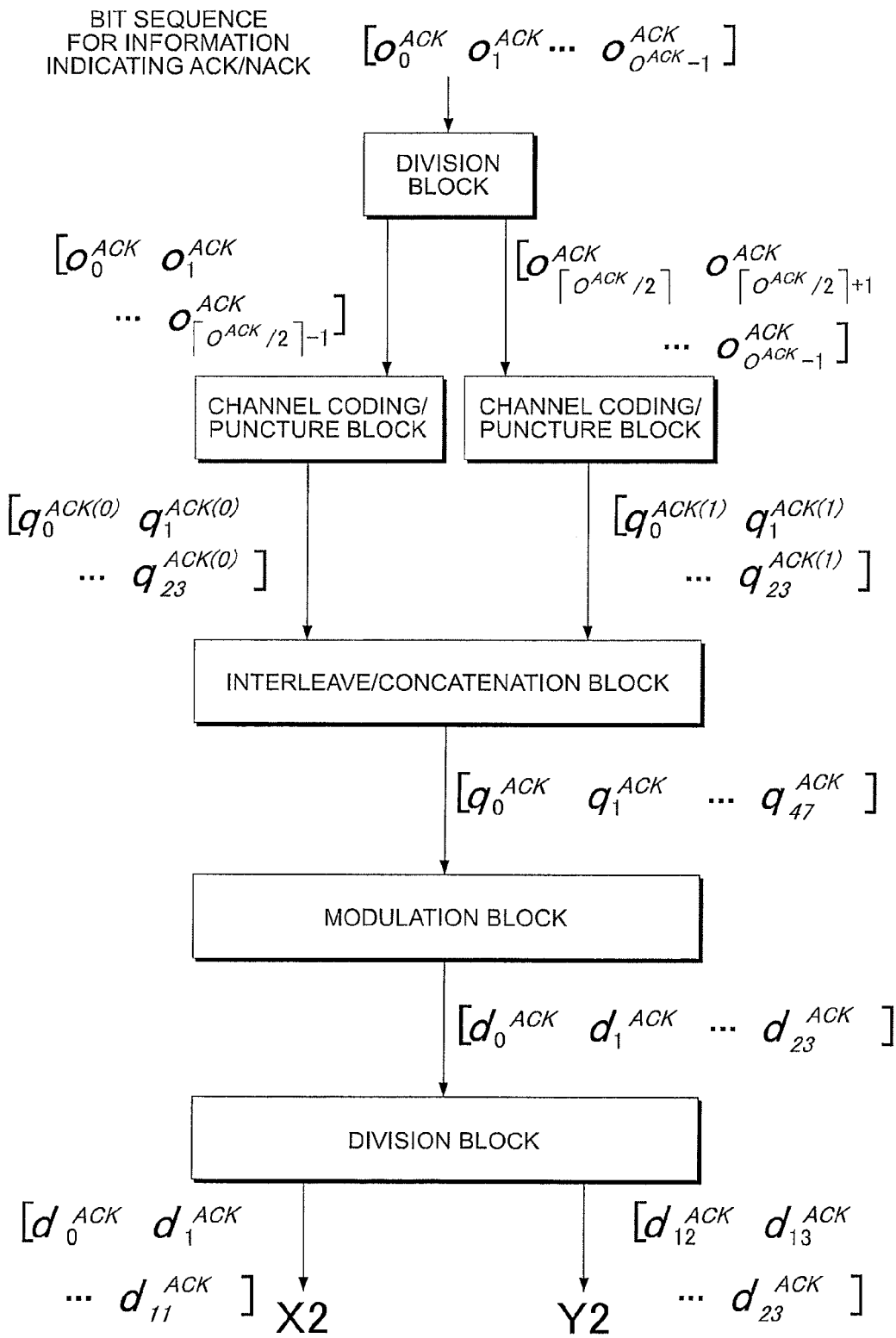

MOBILE STATION APPARATUS, PROCESSING METHOD, AND INTEGRATED CIRCUIT

RELATED APPLICATIONS

This application is a Continuation of copending application Ser. No. 13/881,994 filed on Jun. 17, 2013, which is the U.S. National Phase of PCT/JP2011/074496, filed Oct. 25, 2011, and which claims priority to Application No. 2010-243179 filed in Japan, on Oct. 29, 2010. The entire contents of all of the above applications is hereby incorporated by reference.

TECHNICAL FIELD

The present invention relates to a mobile station apparatus, a processing method, and an integrated circuit.

BACKGROUND ART

3GPP (3rd Generation Partnership Project) is a project that examines and produces the specifications of a mobile communication system based on a network in which W-CDMA (Wideband-Code Division Multiple Access) and GSM (registered trademark) (Global System for Mobile Communications) are developed. In the 3GPP, the W-CDMA system is standardized as a third-generation cellular mobile communication system, and its services have been launched one after another. Moreover, HSDPA (High-speed Downlink Packet Access) in which its communication speed is further increased is also standardized, and its services have been launched. In the 3GPP, a mobile communication system (hereinafter, LTE-A (Long Term Evolution-Advanced) or Advanced-EUTRA) is being examined which utilizes evolution of a third-generation radio access technology (hereinafter, LTE (Long Term Evolution) or EUTRA (Evolved Universal Terrestrial Radio Access)) and a wider frequency band to realize higher-speed data transmission/reception.

Here, as the communication system of the LTE-A, in the downlink, the introduction of an OFDMA method, which is a multicarrier communication method, is being examined, and in the uplink, the introduction of an SC-FDMA method and a DFT-precoded OFDM (DFT-s-OFDM with Spectrum Division Control, Clustered-Single Carrier-Frequency Division Multiple Access) method, which are a single carrier communication method, is being examined.

Moreover, in the LTE-A, it is proposed that a plurality of frequency bands that has the same channel structure as the LTE and is contiguous and/or non-contiguous (which can be referred to as a carrier) (hereinafter, a Cell or a Component Carrier (CC)) is compositely used and is utilized as one wider frequency band (Cell aggregation or Carrier aggregation) (Non-patent document 1).

Here, the mobile station apparatus transmits, to the base station apparatus, information indicating an ACK/NACK (a Positive Acknowledgement/a Negative Acknowledgement, an ACK signal or a NACK signal) of HARQ (Hybrid Automatic Repeat Request) indicating whether or not the decoding of a Downlink Transport Block (Downlink TB, hereinafter, also described as a transport block) received using a Physical Downlink Shared Channel (hereinafter, PDSCH) is succeeded, using a Physical Uplink Control Channel (hereinafter, PUCCH) or a Physical Uplink Shared Channel (hereinafter, PUSCH).

Furthermore, in the LTE-A, it is proposed that the base station apparatus applies MIMO SM (Multiple Input Multiple Output Spatial Multiplexing) to transmit the downlink transport block to the mobile station apparatus (Non-patent document 2). The MIMO SM refers to a technology in which a plurality of signals is multiplexed with the channels of a plurality of spatial dimensions realized by a plurality of transmission antenna ports and a plurality of reception antenna ports and transmitted/received. Here, the antenna port refers to a logical antenna used for signal processing, and one antenna port can be formed with one physical antenna or can be formed with a plurality of physical antennas. In addition, one transmission antenna port may correspond to one reference signal.

For example, the base station apparatus applies the MIMO SM to the PDSCH to transmit a plurality of transport blocks to the mobile station apparatus. In other words, the base station apparatus can apply the MIMO SM to the PDSCH to transmit a plurality of (for example, up to two) transport blocks to the mobile station apparatus. Further, for example, the base station apparatus can apply the MIMO SM to the PDSCH to perform a transmission to the mobile station with up to two Code Words (CWs). The mobile station apparatus transmits the information indicating the ACK/NACK (which may also be the HARQ information, the information indicating the ACK/NACK corresponding to the code word) for the transport block transmitted from the base station apparatus using the PUCCH or PUSCH.

Further, in the LTE-A, it is proposed that the mobile station apparatus performs Reed-Muller (hereinafter, RM) coding on the information indicating the ACK/NACK when transmitting the information indicating the ACK/NACK to the base station apparatus. For example, it is proposed that the mobile station apparatus applies Double RM Coding (hereinafter, DRMC, Double RM Code, Dual RM Coding, Dual RM Code, a coding scheme utilizing two RM codes) to the information indicating the ACK/NACK as a Coding scheme when transmitting the information indicating the ACK/NACK to the base station apparatus (Non-patent document 3). Here, in the LTE-A, TDD (Time Division Duplex) and FDD (Frequency Division Duplex) are supported.

PRIOR ART DOCUMENT

Non-Patent Document

Non-patent document 1: "Carrier aggregation in LTE-Advanced", 3GPP TSG RAN WG1 Meeting #53bis, R1-082468, Jun. 30-Jul. 4, 2008.

Non-patent document 2: "3GPP TR36.814 v9.0.0 (2010-03)", Mar. 30, 2010.

Non-patent document 3: "A/N coding schemes for large payload using DFT-S-OFDM", 3GPP TSG RAN WG1 Meeting #62bis, R1-105247, Oct. 11-15, 2010.

DISCLOSURE OF THE INVENTION

Problems to be Solved by the Invention

However, in the prior art, there is no specific description of how to switch between the coding scheme utilizing the DRMC and a coding scheme utilizing Single RM Coding (hereinafter, SRMC, Single RM Code, a coding scheme utilizing one RM code) when the mobile station apparatus encodes both the information indicating the ACK/NACK and uplink control information (for example, a Scheduling Request (SR) and Channel State Information (CSI), hereinafter, also described as first control information) other than the information indicating the ACK/NACK.

The present invention is made in view of the foregoing situations; an object of the present invention is to provide a mobile station apparatus, a processing method, and an integrated circuit in which, when the mobile station apparatus encodes both the information indicating the ACK/NACK and the first control information, the mobile station apparatus can efficiently switch between the coding scheme utilizing the DRMC and the coding scheme utilizing the SRMC.

Means for Solving the Problems (1) To achieve the above-mentioned object, the present invention takes the following measures. That is, a mobile station apparatus of the present invention is the one that communicates with a base station apparatus on a plurality of serving cells and includes: a unit configured to determine a number of bits of information on a HARQ based on a number of downlink subframes corresponding to the information on a HARQ transmitted in a certain uplink subframe, a number of set serving cells, and a transmission mode set in each serving cell; a unit configured to apply spatial bundling to the information on a HARQ in a case where the determined number of bits of the information on a HARQ exceeds a predetermined value; and a unit configured to select one of a first coding scheme and a second coding scheme based on the number of bits of the information on a HARQ to which the spatial bundling has been applied and a number of bits of a scheduling request, and to code both the information on a HARQ and the scheduling request.

(2) Further, the first coding scheme is a method for coding a bit sequence obtained by concatenating the bits of the information on a HARQ and the bits of the scheduling request, and the second coding scheme is a method for separately coding respective bit sequences, which are obtained by concatenating the bits of the information on a HARQ and the bits of the scheduling request to generate a bit sequence and by dividing the generated bit sequence.

(3) Further, the spatial bundling applied to the information on a HARQ includes processing to perform an AND operation on the bits of the information on a HARQ corresponding to each of a first code word and a second code word, of a physical downlink shared channel received in each downlink subframe in each serving cell.

(4) Further, the information on a HARQ is information indicating an ACK or NACK for the downlink transport block.

(5) Further, a processing method of a mobile station apparatus that communicates with a base station apparatus on a plurality of serving cells, includes the steps of: determining a number of bits of information on a HARQ based on a number of downlink subframes corresponding to the information on a HARQ transmitted in a certain uplink subframe, a number of set serving cells, and a transmission mode set in each serving cell; applying spatial bundling to the information on a HARQ in a case where the determined number of bits of the information on a HARQ exceeds a predetermined value; and selecting one of a first coding scheme and a second coding scheme based on the number of bits of the information on a HARQ to which the spatial bundling has been applied and a number of bits of a scheduling request, and coding both the information on a HARQ and the scheduling request.

(6) Further, the first coding scheme is a method for coding a bit sequence obtained by concatenating the bits of the information on a HARQ and the bits of the scheduling request, and the second coding scheme is a method for separately coding respective bit sequences, which are obtained by concatenating the bits of the information on a HARQ and the bits of the scheduling request to generate a bit sequence and by dividing the generated bit sequence.

(7) Further, the spatial bundling applied to the information on a HARQ includes processing to perform an AND operation on the bits of the information on a HARQ corresponding to each of a first code word and a second code word, of a physical downlink shared channel received in each downlink subframe in each serving cell.

(8) Further, the information on a HARQ is information indicating an ACK or NACK for the downlink transport block.

(9) Further, an integrated circuit mounted on a mobile station apparatus that communicates with a base station apparatus on a plurality of serving cells, includes functions of: determining a number of bits of information on a HARQ based on a number of downlink subframes corresponding to the information on a HARQ transmitted in a certain uplink subframe, a number of set serving cells, and a transmission mode set in each serving cell; applying spatial bundling to the information on a HARQ in a case where the determined number of bits of the information on a HARQ exceeds a predetermined value; and selecting one of a first coding scheme and a second coding scheme based on the number of bits of the information on a HARQ to which the spatial bundling has been applied and a number of bits of a scheduling request, and coding both the information on a HARQ and the scheduling request.

(10) Further, the first coding scheme is a method for coding a bit sequence obtained by concatenating the bits of the information on a HARQ and the bits of the scheduling request, and the second coding scheme is a method for separately coding respective bit sequences, which are obtained by concatenating the bits of the information on a HARQ and the bits of the scheduling request to generate a bit sequence and by dividing the generated bit sequence.

(11) Further, the spatial bundling applied to the information on a HARQ includes processing to perform an AND operation on the bits of the information on a HARQ corresponding to each of a first code word and a second code word, of a physical downlink shared channel received in each downlink subframe in each serving cell.

(12) Further, the information on a HARQ is information indicating an ACK or NACK for the downlink transport block.

Effect of the Invention

There are provided a mobile station apparatus, a communication method, and an integrated circuit in which, when the mobile station apparatus encodes both the information indicating the ACK/NACK and the first control information, the mobile station apparatus can efficiently switch between the coding scheme utilizing the dual Reed-Muller code and the coding scheme utilizing the single Reed-Muller code.

BRIEF DESCRIPTION OF THE DRAWINGS

FIG. 6 is a diagram showing an example of a code word of the Reed-Muller code;

FIG. 7A is a diagram for explaining a coding scheme utilizing a dual Reed-Muller code;

BEST MODES FOR CARRYING OUT THE INVENTION

Figure 1:
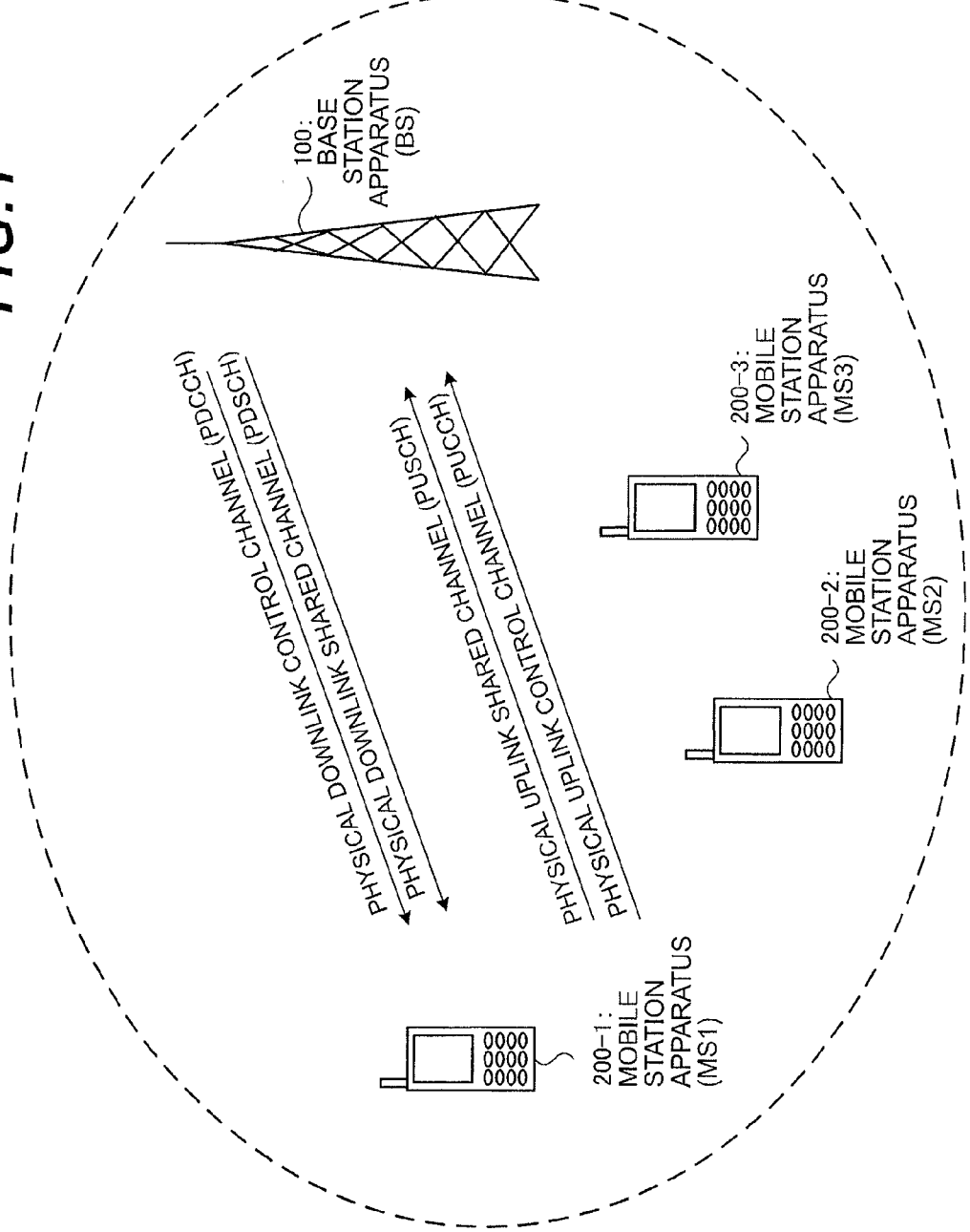
FIG. 1 is a diagram conceptually showing the configuration of physical channels according to an embodiment of the present invention.

Next, an embodiment according to the present invention will be described with reference to the accompanying drawings. FIG. 1 is a diagram showing an example of the configuration of channels in the embodiment of the present invention. Downlink physical channels include a Physical Downlink Control Channel (PDCCH), a Physical Downlink Shared Channel (PDSCH), and the like. Uplink physical channels include a Physical Uplink Shared Channel (PUSCH), a Physical Uplink Control Channel (PUCCH), and the like.

The PDCCH is a channel that is used to notify (specify) mobile station apparatuses 200-1 to 200-3 (the mobile station apparatuses 200-1 to 200-3 are also collectively represented by a mobile station apparatus 200) of the resource allocation of the PDSCH, HARQ processing information for downlink data, the resource allocation of the PUSCH, and the like.

The mobile station apparatus 200, when the resource allocation of the PDSCH is transmitted on the PDCCH addressed to its own apparatus, receives, according to the resource allocation indicated by using the PDCCH from a base station apparatus 100, using the PDSCH, a downlink signal (downlink data (transport block for downlink shared channel (DL-SCH)) and/or downlink control data (downlink control information). In other words, the PDCCH can also be said to be a signal (a Downlink grant or a Downlink assignment) for performing the resource allocation for the downlink.

Moreover, the mobile station apparatus 200, when the resource allocation of the PUSCH is transmitted on the PDCCH addressed to its own apparatus, transmits, according to the resource allocation indicated by using the PDCCH from the base station apparatus 100, using the PUSCH, an uplink signal (uplink data (transport block for uplink shared channel (UL-SCH)) and/or uplink control data (uplink control information). In other words, the PDCCH can also be said to be a signal (an Uplink grant or an Uplink assignment) for allowing the data transmission for the uplink.

The PDCCH is used for transmitting the Downlink Control Information (DCI) such as the downlink assignment and the uplink assignment. The downlink assignment includes, for example, information for the allocation of the resources of the PDSCH transmitted by the base station apparatus 100 to the mobile station apparatus 200. The uplink assignment includes information for the allocation of the resources of the PUSCH transmitted by the mobile station apparatus 200 to the base station apparatus 100. One downlink assignment includes information for the allocation of the resources of one PDSCH in a certain cell; and one uplink assignment includes information for the allocation of the resources of one PUSCH in a certain cell.

Here, for the downlink control information, a plurality of downlink control information formats (DCI formats) is prepared, and different DCI formats are used for different purposes. For example, the DCI format is defined by the size and the order of a plurality of fields mapped onto the DCI format, the types of information mapped onto the fields, and the like.

For example, as the DCI format used as the downlink assignment, a DCI format 1/1A that is used when the PDSCH is transmitted by the base station apparatus 100 with a single antenna port (for example, one PDSCH cord word (one transport block) is transmitted) is defined. Moreover, for example, as the DCI format used as the downlink assignment, a DCI format 2 that is used when the PDSCH is transmitted by the base station apparatus 100 with multiple antenna ports (for example, up to two PDSCH cord words (up to two transport blocks) are transmitted) is defined.

The PDSCH is a channel that is used for transmitting the downlink data (transport block for the downlink shared channel (DL-SCH)) or paging information (paging channel: PCH). The base station apparatus 100 uses the PDSCH allocated by the PDCCH to transmit the downlink transport block (transport block for the downlink shared channel (DL-SCH)) to the mobile station apparatus 200.

Here, the downlink data indicates, for example, user data; the DL-SCH is a transport channel. Moreover, a unit for transmitting the downlink data (DL-SCH) through the PDSCH is referred to as a Transport Block (TB); the transport block is a unit handled in a MAC (Media Access Control) layer. In the DL-SCH, a HARQ and dynamic adaptive radio link control are supported, and beam forming is available. In the DL-SCH, dynamic resource allocation and quasi-static resource allocation are supported.

Here, the transport block is associated with the Code Word (CW) in the physical layer. For example, the base station apparatus 100 can apply the MIMO SM to the PDSCH to perform a transmission with up to two code words.

The PUSCH is a channel that is used for mainly transmitting the uplink data (transport block for the uplink shared channel (UL-SCH)). The mobile station apparatus 200 uses the PUSCH allocated by the PDCCH transmitted from the base station apparatus 100 to transmit the uplink transport block (transport block for the uplink shared channel (UL-SCH)) to the base station apparatus 100.

Furthermore, when the base station apparatus 100 performs scheduling on the mobile station apparatus 200, the Uplink Control Information (UCI) is transmitted using the PUSCH. Here, the uplink control information includes Channel State Information (CSI), Channel Quality Indicator (CQI), Precoding Matrix Indicator (PMI), and Rank Indicator (RI). The information indicating the ACK/NACK of HARQ for the downlink transport block (DL-SCH) is included in the uplink control information. The Scheduling Request (SR) which is used for requesting resource allocation for the transmission of the uplink data (requesting a transmission through the UL-SCH) by the mobile station apparatus 200 is included in the uplink control information.

That is, the channel state information (CSI), the channel quality indicator (CQI), the precoding matrix indicator (PMI), the rank indicator (RI), and the scheduling request (SR) are the uplink control information (the first control information) other than the information indicating the ACK/NACK.

Here, the uplink data indicates, for example, user data; the UL-SCH is a transport channel. In addition, a unit for transmitting the uplink data (UL-SCH) through the PUSCH is referred to as a Transport Block (TB); the transport block is a unit handled in the MAC (Media Access Control) layer. Moreover, the PUSCH and PUCCH are physical channels that are defined by (consists of) the time domain and the frequency domain. In the UL-SCH, a HARQ and dynamic adaptive radio link control are supported, and the beam forming is available. In the UL-SCH, dynamic resource allocation and quasi-static resource allocation are supported.

Furthermore, a radio resource control signal (hereinafter, a RRC signaling: a Radio Resource Control Signaling) exchanged between the base station apparatus 100 and the mobile station apparatus 200 may be included in the uplink data (UL-SCH) and the downlink data (DL-SCH). Moreover, a MAC (Medium Access Control) control element exchanged between the base station apparatus 100 and the mobile station apparatus 200 may be included in the uplink data (UL-SCH) and the downlink data (DL-SCH).

The base station apparatus 100 and the mobile station apparatus 200 transmit and receive the RRC signaling in a higher layer (a Radio Resource Control Layer). In addition, the base station apparatus 100 and the mobile station apparatus 200 also transmit and receive the MAC control element in a higher layer (a Medium Access Control (MAC) layer).

The PUCCH is a channel that is used for transmitting the uplink control information. Here, the uplink control information includes the channel state information (CSI), the channel quality indicator (CQI), the precoding matrix indicator (PMI), and the rank indicator (RI). Furthermore, the information indicating the ACK/NACK of HARQ for the downlink transport block (DL-SCH) is included in the uplink control information. The scheduling request (SR) for requesting resource allocation for the transmission of the uplink data (requesting a transmission through the UL-SCH) by the mobile station apparatus 200 is included in the uplink control information.

[Configuration of the Base Station Apparatus 100]

Figure 2:
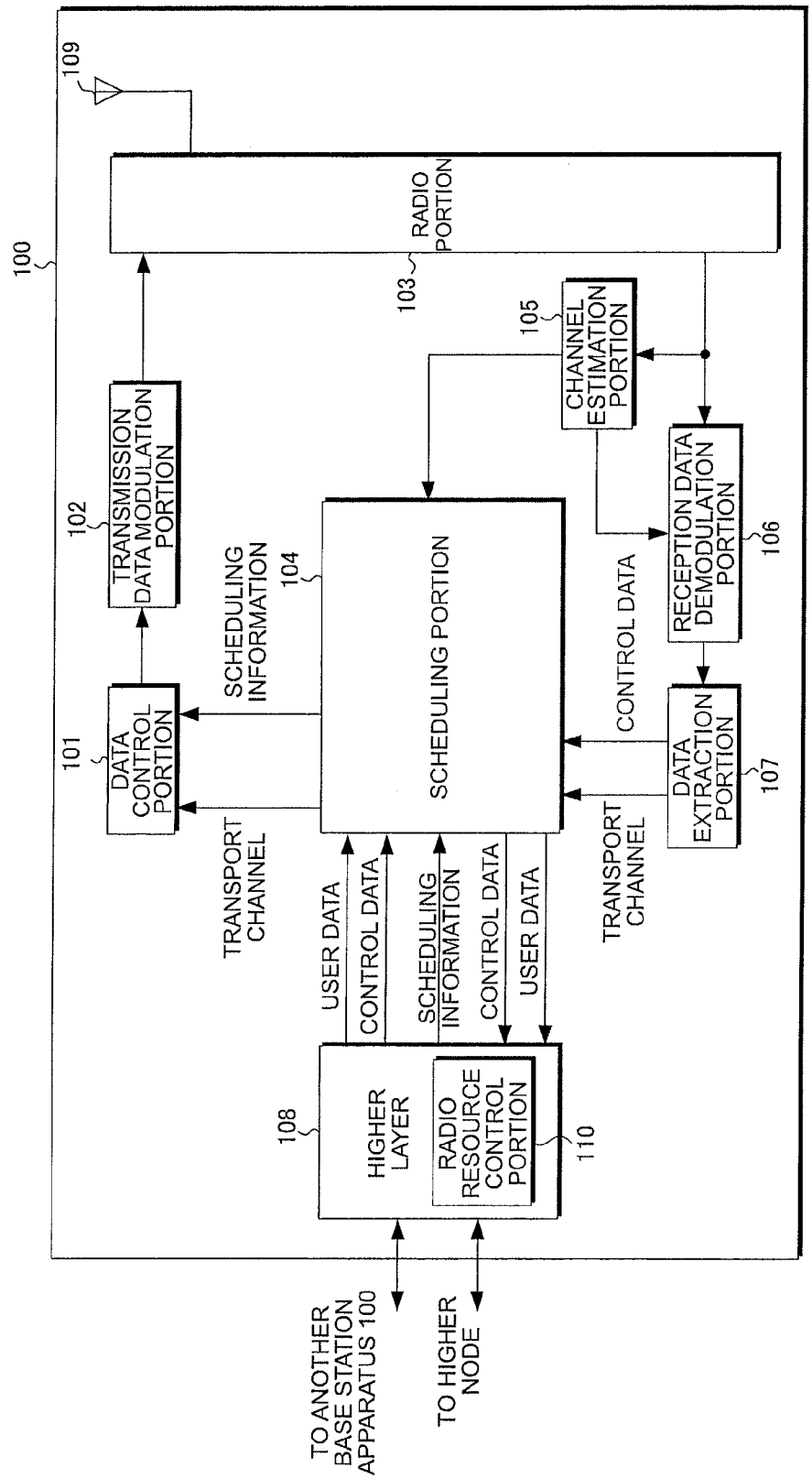
FIG. 2 is a block diagram showing the schematic configuration of a base station apparatus according to the embodiment of the present invention.

FIG. 2 is a block diagram showing the schematic configuration of the base station apparatus 100 according to the embodiment of the present invention. The base station apparatus 100 includes a data control portion 101, a transmission data modulation portion 102, a radio portion 103, a scheduling portion 104, a channel estimation portion 105, a reception data demodulation portion 106, a data extraction portion 107, a higher layer 108, and an antenna 109. In addition, the radio portion 103, the scheduling portion 104, the channel estimation portion 105, the reception data demodulation portion 106, the data extraction portion 107, the higher layer 108, and the antenna 109 constitute a reception portion; the data control portion 101, the transmission data modulation portion 102, the radio portion 103, the scheduling portion 104, the higher layer 108, and the antenna 109 constitute a transmission portion.

The antenna 109, the radio portion 103, the channel estimation portion 105, the reception data demodulation portion 106, and the data extraction portion 107 perform processing on the uplink physical layer. The antenna 109, the radio portion 103, the transmission data modulation portion 102, and the data control portion 101 perform processing on the downlink physical layer.

The data control portion 101 receives the transport channel from the scheduling portion 104. The data control portion 101 maps, onto the physical channel, the transport channel and a signal and a channel generated in the physical layer, based on the scheduling information input from the scheduling portion 104. The individual pieces of data mapped as described above are output to the transmission data modulation portion 102.

The transmission data modulation portion 102 modulates transmission data into an OFDM system. On the basis of the scheduling information from the scheduling portion 104 and a modulation scheme and a coding scheme corresponding to each PRB, the transmission data modulation portion 102 performs, on the data input from the data control portion 101, signal processing, such as data modulation, coding, series/parallel transform for an input signal, IFFT (Inverse Fast Fourier Transform) processing, CP (Cyclic Prefix) insertion, and filtering, generates transmission data and outputs it to the radio portion 103. Here, the scheduling information includes downlink physical resource block PRB (Physical Resource Block) allocation information, for example, physical resource block position information formed with a frequency and time; the modulation scheme and the coding scheme corresponding to each PRB include, for example, information, such as a modulation scheme: 16 QAM and a coding rate: 2/3 coding rate.

The radio portion 103 upconverts modulation data input from the transmission data modulation portion 102 into a radio frequency to generate a radio signal, and transmits it through the antenna 109 to the mobile station apparatus 200. Moreover, the radio portion 103 receives, through the antenna 109, an uplink radio signal from the mobile station apparatus 200, downconverts it into a baseband signal and outputs the reception data to the channel estimation portion 105 and the reception data demodulation portion 106.

The scheduling portion 104 performs processing on the Medium Access Control (MAC) layer. The scheduling portion 104 performs mapping of a logical channel and the transport channel, scheduling (such as HARQ processing and the selection of the transport format) on the downlink and the uplink, and the like. In the scheduling portion 104, in order to integrally control the processing portion of each physical layer, there are interfaces between the scheduling portion 104 and the antenna 109, the radio portion 103, the channel estimation portion 105, the reception data demodulation portion 106, the data control portion 101, the transmission data modulation portion 102, and the data extraction portion 107 (however, not shown).

In the downlink scheduling, based on the uplink control information (such as the CSI, the CQI, the information indicating the ACK/NACK, and the scheduling request) received from the mobile station apparatus 200, information on the PRB available for each mobile station apparatus 200, buffer status, the scheduling information input from the higher layer 108, and the like, the scheduling portion 104 performs processing for selecting the downlink transport format (transmission mode, that is, the allocation of physical resource blocks, the modulation scheme, the coding scheme, and the like) for modulating each piece of data, retransmission control on a HARQ, and the generation of the scheduling information used in the downlink. The scheduling information used for the downlink scheduling is output to the data control portion 101.

Furthermore, in the uplink scheduling, based on the result of the estimation of the channel state (radio channel state) of the uplink output by the channel estimation portion 105, a resource allocation request from the mobile station apparatus 200, information on the PRB available for each mobile station apparatus 200, the scheduling information input from the higher layer 108, and the like, the scheduling portion 104 performs processing for selecting the uplink transport format (transmission mode, that is, the allocation of the physical resource blocks, the modulation scheme, the coding scheme, and the like) for modulating each piece of data and the generation of the scheduling information used in the uplink scheduling. The scheduling information used for the uplink scheduling is output to the data control portion 101.

In addition, the scheduling portion 104 also maps the downlink logical channel input from the higher layer 108 onto the transport channel, and outputs it to the data control portion 101. Moreover, the scheduling portion 104 also processes, as necessary, the control data and the transport channel input from the data extraction portion 107 and acquired through the uplink, thereafter maps them onto the uplink logical channel and outputs them to the higher layer 108.

In order to demodulate the uplink data, the channel estimation portion 105 estimates the channel state of the uplink from an Uplink Demodulation Reference Signal (UDRS), and outputs the result of the estimation to the reception data demodulation portion 106. In order to perform the uplink scheduling, the channel estimation portion 105 also estimates the channel state of the uplink from an uplink measurement reference signal (Sounding Reference Signal (SRS)), and outputs the estimation result to the scheduling portion 104.

The reception data demodulation portion 106 also serves as an OFDM demodulation portion and/or a DFT-Spread-OFDM (DFT-S-OFDM) demodulation portion that demodulates the reception data modulated into the OFDM system and/or the SC-FDMA system. On the basis of the channel state estimation result of the uplink input from the channel estimation portion 105, the reception data demodulation portion 106 performs demodulation processing by applying, to the modulation data input from the radio portion 103, signal processing such as DFT transform, subcarrier mapping, IFFT transform, and filtering, and outputs the demodulated data to the data extraction portion 107.

The data extraction portion 107 checks whether or not the data input from the reception data demodulation portion 106 is correct, and outputs the check result (ACK or NACK) to the scheduling portion 104. Furthermore, the data extraction portion 107 separates the data input from the reception data demodulation portion 106 into the transport channel and the control data on the physical layer, and outputs them to the scheduling portion 104. The separated control data includes the CSI and the CQI transmitted from the mobile station apparatus 200, the information indicting the ACK/NACK, the scheduling request, and the like.

The higher layer 108 performs processing on a Packet Data Convergence Protocol (PDCP) layer, a Radio Link Control (RLC) layer, and a Radio Resource Control (RRC) layer. In the higher layer 108, in order to integrally control the processing portion of a lower layer, there are interfaces between the higher layer 108 and the scheduling portion 104, the antenna 109, the radio portion 103, the channel estimation portion 105, the reception data demodulation portion 106, the data control portion 101, the transmission data modulation portion 102, and the data extraction portion 107 (however, not shown).

The higher layer 108 has a radio resource control portion 110 (also called a control portion). In addition, the radio resource control portion 110 performs management on various types of setting information, management on system information, paging control, management on the communication state of each mobile station apparatus 200, mobility management such as handover or the like, management on the buffer status of each mobile station apparatus 200, management on the connection setting of a unicast and a multicast bearer, management on a mobile station identifier (UEID), and the like. The higher layer 108 exchanges information with another base station apparatus 100 and information with the higher node.

[Configuration of the Mobile Station Apparatus 200]

Figure 3:
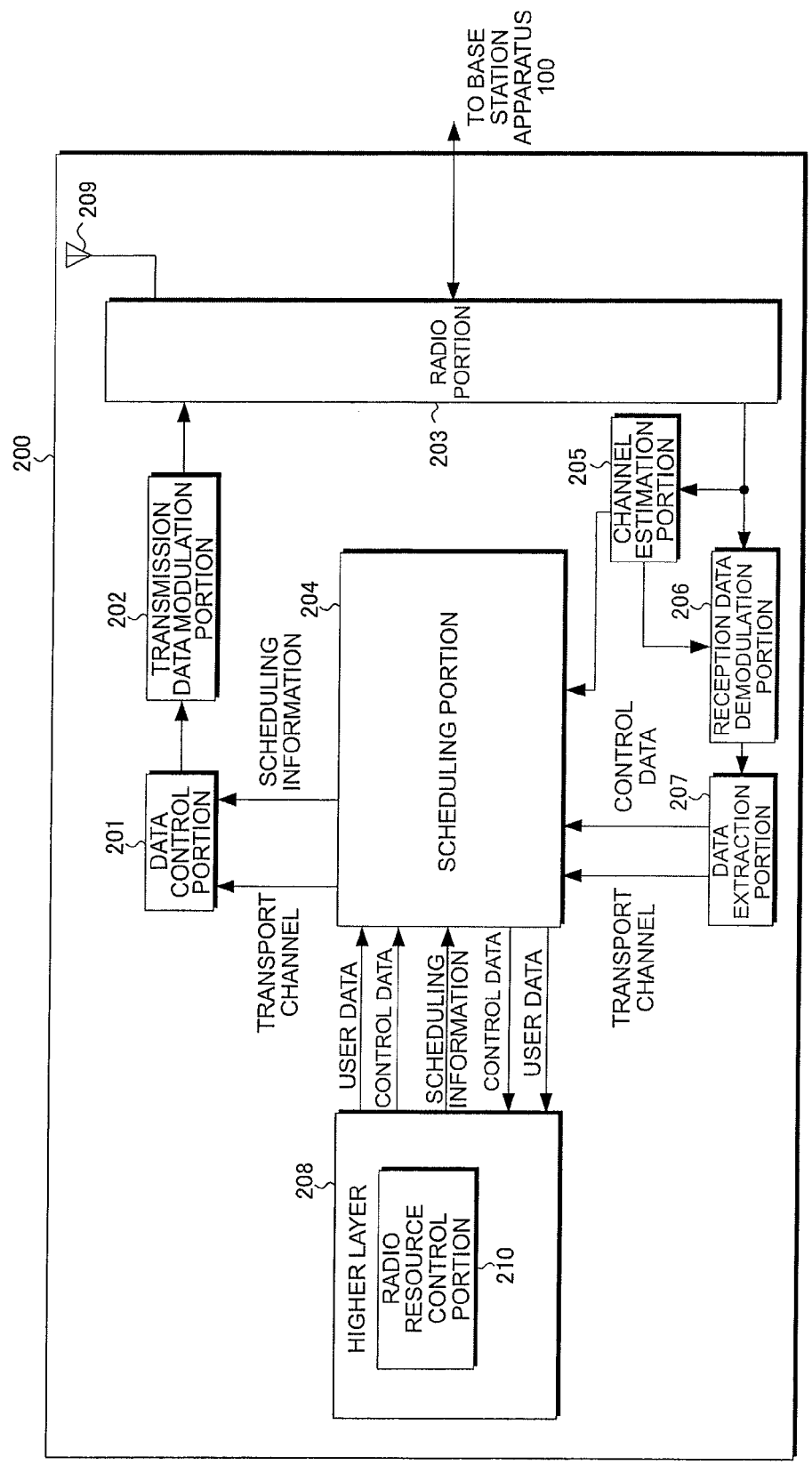
FIG. 3 is a block diagram showing the schematic configuration of a mobile station apparatus according to the embodiment of the present invention.

FIG. 3 is a block diagram showing the schematic configuration of the mobile station apparatus 200 according to the embodiment of the present invention. The mobile station apparatus 200 includes a data control portion 201, a transmission data modulation portion 202, a radio portion 203, a scheduling portion 204, a channel estimation portion 205, a reception data demodulation portion 206, a data extraction portion 207, a higher layer 208, and an antenna 209. Moreover, the data control portion 201, the transmission data modulation portion 202, the radio portion 203, the scheduling portion 204, the higher layer 208, and the antenna 209 constitute a transmission portion; the radio portion 203, the scheduling portion 204, the channel estimation portion 205, the reception data demodulation portion 206, the data extraction portion 207, the higher layer 208, and the antenna 209 constitute a reception portion.

The data control portion 201, the transmission data modulation portion 202, and the radio portion 203 perform processing on the uplink physical layer. The radio portion 203, the channel estimation portion 205, the reception data demodulation portion 206, and the data extraction portion 207 perform processing on the downlink physical layer.

The data control portion 201 receives the transport channel from the scheduling portion 204. The transport channel and the signal and the channel generated in the physical layer are mapped onto the physical channel based on the scheduling information input from the scheduling portion 204. The individual pieces of data mapped as described above are output to the transmission data modulation portion 202.

The transmission data modulation portion 202 modulates transmission data into the OFDM system and/or the SC-FDMA system. The transmission data modulation portion 202 performs, on the data input from the data control portion 201, signal processing such as data modulation, DFT (Discrete Fourier Transform) processing, subcarrier mapping, IFFT (Inverse Fast Fourier Transform) processing, CP insertion, and filtering, generates transmission data and outputs it to the radio portion 203.

The radio portion 203 upconverts modulation data input from the transmission data modulation portion 202 into a radio frequency to generate a radio signal, and transmits it through the antenna 209 to the base station apparatus 100. Furthermore, the radio portion 203 receives, through the antenna 209, the radio signal modulated by the downlink data from the base station apparatus 100, downconverts it into a baseband signal and outputs the reception data to the channel estimation portion 205 and the reception data demodulation portion 206.

The scheduling portion 204 performs processing on the Medium Access Control (MAC) layer. The scheduling portion 204 performs mapping of the logical channel and the transport channel, scheduling (such as HARQ processing and the selection of the transport format) on the downlink and the uplink, and the like. In the scheduling portion 204, in order to integrally control the processing portion of each physical layer, there are interfaces between the scheduling portion 204 and the antenna 209, the data control portion 201, the transmission data modulation portion 202, the channel estimation portion 205, the reception data demodulation portion 206, the data extraction portion 207, and the radio portion 203 (however, not shown).

In the downlink scheduling, based on the scheduling information (the transport format and HARQ retransmission information) from the base station apparatus 100 and the higher layer 208, the scheduling portion 204 performs reception control on the transport channel, the physical signal and the physical channel and generates the scheduling information used in a HARQ retransmission control and the downlink scheduling. The scheduling information used in the downlink scheduling is output to the data control portion 201.

In the uplink scheduling, based on buffer status in the uplink input from the higher layer 208, the scheduling information (such as the transport format and HARQ retransmission control) for the uplink from the base station apparatus 100 input from the data extraction portion 207, the scheduling information input from the higher layer 208, and the like, the scheduling portion 204 performs scheduling processing for mapping the uplink logical channel input from the higher layer 208 onto the transport channel and generates the scheduling information used in the uplink scheduling. Note that, for the uplink transport format, information notified from the base station apparatus 100 is utilized. The scheduling information described above is output to the data control portion 201.

In addition, the scheduling portion 204 also maps the uplink logical channel input from the higher layer 208 onto the transport channel, and outputs it to the data control portion 201. Moreover, the scheduling portion 204 also outputs, to the data control portion 201, the CSI, the CQI, the PMI, and the RI input from the channel estimation portion 205 and the check result of the CRC check input from the data extraction portion 207. Furthermore, the scheduling portion 204 processes, as necessary, the control data input from the data extraction portion 207 and acquired through the downlink and the transport channel, thereafter maps them onto the downlink logical channel and outputs them to the higher layer 208.

In order to demodulate the downlink data, the channel estimation portion 205 estimates the channel state of the downlink from the downlink reference signal, and outputs the estimation result to the reception data demodulation portion 206. In addition, in order to notify the base station apparatus 100 of the estimation result of the downlink channel state (radio channel state, the CSI, the CQI, and the like), the channel estimation portion 205 estimates the downlink channel state from the downlink reference signal, and outputs the estimation result to the scheduling portion 204 as, for example, the CSI and the CQI.

The reception data demodulation portion 206 demodulates the reception data modulated into the OFDM system. The reception data demodulation portion 206 performs, based on the estimation result of the downlink channel state input from the channel estimation portion 205, the demodulation processing on the modulation data input from the radio portion 203, and outputs it to the data extraction portion 207.

The data extraction portion 207 performs the CRC check on the data input from the reception data demodulation portion 206 to check whether or not the data is correct, and outputs the check result (the information indicating an ACK or NACK) to the scheduling portion 204. Moreover, the data extraction portion 207 separates the data input from the reception data demodulation portion 206 into the transport channel and the control data on the physical layer, and outputs them to the scheduling portion 204. The separated control data includes the scheduling information, such as the resource allocation of the downlink and the uplink and the uplink HARQ control information.

The higher layer 208 performs processing on the Packet Data Convergence Protocol (PDCP) layer, the Radio Link Control (RLC) layer, and the Radio Resource Control (RRC) layer. In the higher layer 208, in order to integrally control the processing portion of the lower layer, there are interfaces between the higher layer 208 and the scheduling portion 204, the antenna 209, the data control portion 201, the transmission data modulation portion 202, the channel estimation portion 205, the reception data demodulation portion 206, the data extraction portion 207, and the radio portion 203 (however, not shown).

The higher layer 208 has a radio resource control portion 210 (also called a control portion). The radio resource control portion 210 performs management on various types of setting information, management on system information, paging control, management on the communication state of its own station, mobility management such as handover, management on the buffer status, management on the connection setting of the unicast and the multicast bearer, and management on the mobile station identifier (UEID).

[Cell Aggregation (Carrier Aggregation)]

Figure 4:
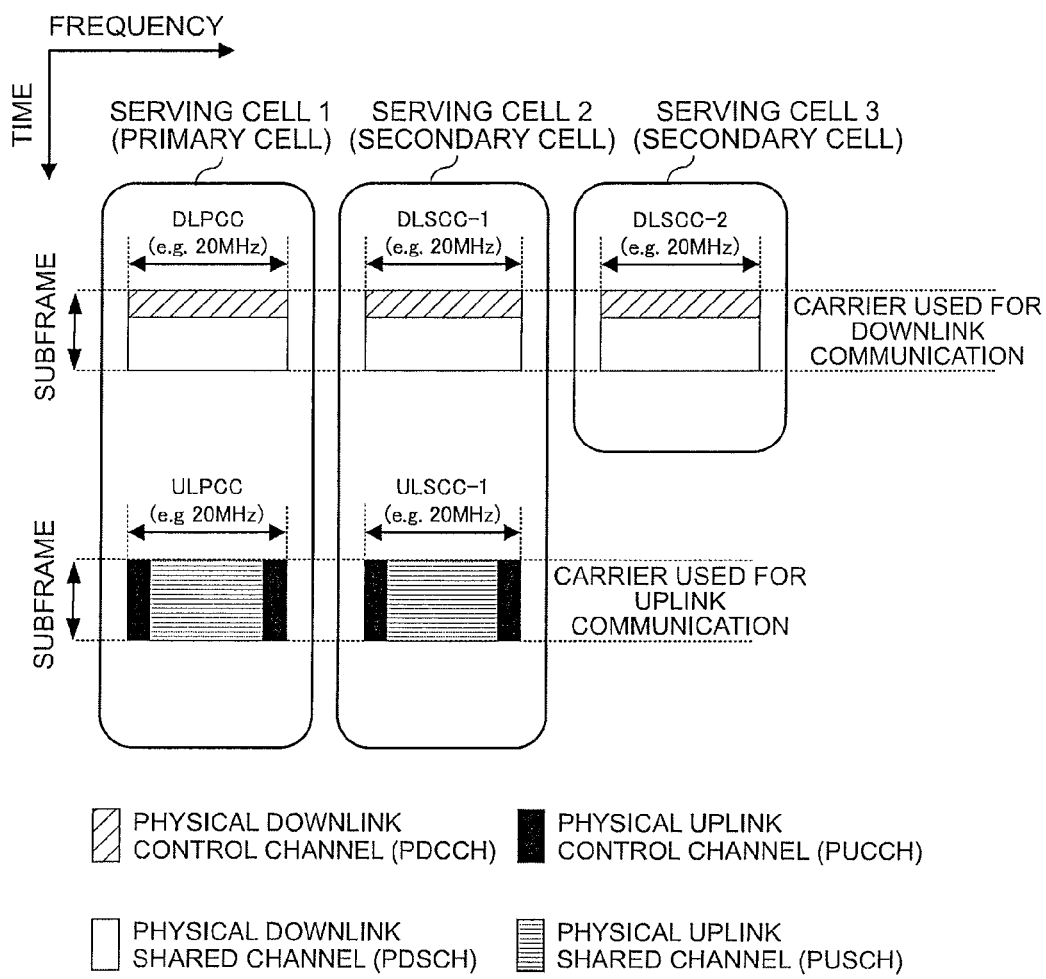
FIG. 4 is a diagram showing an example of a mobile communication system to which the embodiment of the present invention can be applied.

FIG. 4 is a diagram showing an example of the processing of the base station apparatus 100 and the mobile station apparatus 200 in the mobile communication system that supports cell aggregation (or carrier aggregation). In the mobile communication system according to the present invention, the cell aggregation is supported in the uplink and the downlink (for example, up to five cells (or component carriers) are supported in the uplink and the downlink), and each cell can have a transmission bandwidth (transmission bandwidth equivalent to the LTE) of up to 110 resource blocks.

In FIG. 4, the horizontal axis represents the frequency domain and the vertical axis represents the time domain. FIG. 4 shows that three serving cells (serving cell 1, serving cell 2, and serving cell 3) are aggregated. Here, in FIG. 4, among a plurality of aggregated serving cells, for example, one serving cell is defined as a Primary cell (Pcell). For example, the primary cell is defined as a serving cell having the function equivalent to that of the cell of the LTE.

In addition, in FIG. 4, the serving cells other than the primary cell are defined as secondary cells (Scell). The secondary cell is a cell having a function limited as compared with the primary cell; for example, the secondary cell is mainly used for transmitting and receiving the PDSCH and/or the PUSCH.

Here, in the downlink, the carrier corresponding to the serving cell is referred to as a Downlink Component Carrier (DLCC). Moreover, in the uplink, the carrier corresponding to the serving cell is referred to as an Uplink Component Carrier (ULCC).

Moreover, in the downlink, the carrier corresponding to the primary cell is referred to as a Downlink Primary Component Carrier (DLPCC). Furthermore, in the downlink, the carrier corresponding to the secondary cell is referred to as a Downlink Secondary Component Carrier (DLSCC). In addition, in the uplink, the carrier corresponding to the primary cell is referred to as an Uplink Primary Component Carrier (ULSCC). Furthermore, in the uplink, the carrier corresponding to the secondary cell is referred to as an Uplink Secondary Component Carrier (ULSCC).

Here, the base station apparatus 100 can configure the primary cell for the mobile station apparatus 200. For example, the base station apparatus 100 can configure the primary cell for the mobile station apparatus 200 in a manner specific to the mobile station apparatus (UE-specifically) by using the RRC signaling. Likewise, the base station apparatus 100 can configure the secondary cell for the mobile station apparatus 200. For example, the base station apparatus 100 can configure the secondary cell for the mobile station apparatus 200 in a manner specific to the mobile station apparatus (UE-specifically) by using the RRC signaling.

FIG. 4 shows the serving cell 1 as the primary cell, and the serving cell 2 and the serving cell 3 as the secondary cells. The base station apparatus 100 can configure, as the primary cell, the DLCC and the ULCC (DLPCC and ULPCC) of the serving cell 1. Furthermore, the base station apparatus 100 can also configure, as the secondary cell, the DLCC and the ULCC (DLSCC-1 and ULSCC-1) of the serving cell 2. Furthermore, the base station apparatus 100 can configure, as the secondary cell, only the DLCC (DLSCC-2) of the serving cell 3.

Further, in FIG. 4, for example, in each DLCC, the PDCCH represented by rightwardly upward oblique lines is mapped. In addition, in each DLCC, the PDSCH painted white is mapped. That is, the PDCCH and the PDSCH are time-multiplexed. For example, in each ULCC, the PUCCH painted black is mapped. Furthermore, in each ULCC, the PUSCH represented by horizontal lines is mapped. That is, the PUCCH and the PUSCH are frequency-multiplexed.

In FIG. 4, the base station apparatus 100 and the mobile station apparatus 200 can transmit and receive one PDCCH in one serving cell (DLCC). Moreover, the base station apparatus 100 and the mobile station apparatus 200 can also transmit and receive one PDSCH in one serving cell (DLCC). Furthermore, the base station apparatus 100 and the mobile station apparatus 200 can also transmit and receive one PUSCH in one serving cell (ULCC). Furthermore, the base station apparatus 100 and the mobile station apparatus 200 can transmit and receive one PUCCH in one serving cell (ULCC).

For example, in FIG. 4, the base station apparatus 100 and the mobile station apparatus 200 can use three DLCCs to transmit and receive three PDCCHs in the same subframe. In addition, the base station apparatus 100 and the mobile station apparatus 200 can also use three DLCCs to transmit and receive three PDSCHs in the same subframe. Moreover, the base station apparatus 100 and the mobile station apparatus 200 can also use two ULCCs to transmit and receive two PUSCHs in the same subframe. Here, the base station apparatus 100 and the mobile station apparatus 200 can transmit and receive only one PUCCH in the same subframe. Here, the base station apparatus 100 and the mobile station apparatus 200 can support both the TDD (Time Division Duplex) and the FDD (Frequency Division Duplex).

Further, when the base station apparatus 100 and the mobile station apparatus 200 transmit and receive information by utilizing the TDD, the correspondence between the subframe reserved for the downlink transmission and the subframe reserved for the uplink transmission (a correspondence (a relationship) between the downlink subframe and the uplink subframe, TDD configuration) is configured, for example, for the mobile station apparatus 200 by the RRC signaling from the base station apparatus 100.

Hereinafter, when the base station apparatus 100 and the mobile station apparatus 200 transmit and receive information by utilizing the TDD, it is assumed basically that the downlink information (for example, the transport block) is transmitted and received using four downlink subframes and the uplink information (for example, the information indicating the ACK/NACK for the (four) transport blocks transmitted in the four subframes, respectively) is transmitted and received using one uplink subframe.

That is, in FIG. 4, the base station apparatus 100 and the mobile station apparatus 200 can transmit and receive 12 (at the maximum) PDCCHs in four subframes by utilizing the TDD. Further, for example, the base station apparatus 100 and the mobile station apparatus 200 can transmit and receive 12 (at the maximum) transport blocks in four subframes by utilizing the TDD in the case where the transmission mode in which one transport block is transmitted on each serving cell is configured.

Similarly, for example, the base station apparatus 100 and the mobile station apparatus 200 can transmit and receive 20 (at the maximum) PDCCHs in four subframes by aggregating five serving cells and by utilizing the TDD. Further, for example, the base station apparatus 100 and the mobile station apparatus 200 can transmit and receive 20 (at the maximum) transport blocks in four subframes by aggregating five serving cells and by utilizing the TDD in the case where the transmission mode in which one transport block is transmitted on each serving cell is configured.

Further, for example, the base station apparatus 100 and the mobile station apparatus 200 can transmit and receive 40 (at the maximum) transport blocks in four subframes by aggregating five serving cells and by utilizing the TDD in the case where the transmission mode in which up to two transport blocks are transmitted on each serving cell is configured.

At this time, for example, the base station apparatus 100 and the mobile station apparatus 200 transmit and receive the information indicating the ACK/NACK for 40 (at the maximum) transport blocks in one uplink subframe. That is, for example, in the case where the information indicating the ACK/NACK for one transport block is expressed by one bit, the base station apparatus 100 and the mobile station apparatus 200 transmit and receive 40-bit information as the information indicating the ACK/NACK for 40 transport blocks. That is, the mobile station apparatus 200 transmits the information indicating the ACK/NACK corresponding to a plurality of downlink subframes in a certain uplink subframe.

Here, the base station apparatus 100 and the mobile station apparatus 200 can compress (which can also be said to reduce) the number of bits of the information indicating the ACK/NACK (the number of information bits) by spatially bundling (hereinafter, spatial bundling) the information indicating the ACK/NACK. For example, the base station apparatus 100 and the mobile station apparatus 200 perform the AND operation or the OR operation on each of the bits of the ACK/NACK corresponding to two code words (transport blocks) and transmit and receive the calculated information (value, bit) as the information indicating the ACK/NACK.

For example, when transmitting the ACK in correspondence to the first code word of the PDSCH and the NACK in correspondence to the second code word of the PDSCH, the mobile station apparatus 200 can perform a transmission as the NACK by applying the spatial bundling to the information. Further, for example, when transmitting the ACK in correspondence to the first code word of the PDSCH and the ACK in correspondence to the second code word of the PDSCH, the mobile station apparatus 200 can perform a transmission as the ACK by applying the spatial bundling to the information.

For example, when transmitting 40 (at the maximum) transport blocks, by applying the spatial bundling to the information indicating the ACK/NACK corresponding to the first code word of the PDSCH and the information indicating the ACK/NACK corresponding to the second code word of the PDSCH, the mobile station apparatus 200 can compress the information into the information indicating the ACK/NACK with the amount of information of 20 (at the maximum) bits and transmit the compressed information indicating the ACK/NACK. That is, the mobile station apparatus 200 applies the spatial bundling to the bits of the information indicating the ACK/NACK corresponding to the first code word and the second code word, respectively, of the PDSCH received in each downlink subframe on each serving cell.

Here, the number of bits (the number of bits before the spatial bundling is applied) of the information indicating the ACK/NACK transmitted and received by the base station apparatus 100 and the mobile station apparatus 200 is determined by the serving cells (the number of serving cells, the number of the primary cell and the secondary cells) and the downlink transmission mode (downlink data transmission using the single antenna port (the transmission of the PDSCH using the single antenna port, the transmission of the PDSCH by the Non-MIMO mode, the transmission of one transport block), or the downlink data transmission using the multiple antenna ports (the transmission of the PDSCH using the multiple antenna ports, the transmission of the PDSCH to which the MIMO is applied, the transmission of up to two transport blocks)) in each serving cell. Here, the serving cells and the downlink transmission mode in each serving cell are configured by the base station apparatus 100.

Further, the number of bits (the number of bits before spatial bundling is applied) of the information indicating the ACK/NACK transmitted and received by the base station apparatus 100 and the mobile station apparatus 200 is determined by the correspondence (TDD configuration) between the downlink subframe and the uplink subframe configured by the RRC signaling from the base station apparatus 100.

For example, in the case where the base station apparatus 100 configures three serving cells and configures the transmission of the PDSCH using the multiple antenna ports (the transmission of up to two transport blocks) as the downlink transmission mode for each serving cell, the number of bits of the information indicating the ACK/NACK will be six.

Further, for example, in the case where the base station apparatus 100 and the mobile station apparatus 200 transmit and receive the PDSCH in all the serving cells in, for example, all the four subframes by utilizing the TDD in this setting, the number of bits of the information indicating the ACK/NACK will be 24 (six bits×four subframes).

Similarly, in the case where the base station apparatus 100 configures three serving cells and configures the transmission of the PDSCH using the single antenna port (the transmission of one transport block) for one serving cell and the transmission of the PDSCH using the multiple antenna ports (the transmission of up to two transport blocks) for two serving cells as the downlink transmission mode for each serving cell, the number of bits of the information indicating the ACK/NACK will be five.

Similarly, in the case where the base station apparatus 100 and the mobile station apparatus 200 transmit and receive the PDSCH in all the serving cells in, for example, all the four subframes by utilizing the TDD in this setting, the number of bits of the information indicating the ACK/NACK will be 20 (five bits×four subframes).

Here, for example, in the case where the number of bits of the information indicating the ACK/NACK determined based on the serving cells and the downlink transmission mode for each serving cell that are configured by the base station apparatus 100 exceeds 20, the mobile station apparatus 200 may compress the number of bits of the information indicating the ACK/NACK by applying the spatial bundling (automatically applying the spatial bundling based on the configuration by the base station apparatus 100).

That is, in the case where the number of bits of the information indicating the ACK/NACK determined based on the configuration by the base station apparatus 100 exceeds a predetermined number of bits (a predetermined value), the mobile station apparatus 200 can compress the number of bits of the information indicating the ACK/NACK by automatically applying the spatial bundling. Here, the number of bits of the information indicating the ACK/NACK to which the mobile station apparatus 200 applies the spatial bundling is defined preliminarily in the specifications and the like, for example.

That is, for example, in the case where the number of bits of the information indicating the ACK/NACK exceeds the number of bits (for example, 20 bits) that can be transmitted in one subframe of the PUCCH when transmitting the information indicating the ACK/NACK to the base station apparatus 100 using the PUCCH, the mobile station apparatus 200 can compress the information indicating the ACK/NACK so as to have a number of bits equal to or less than the number of bits that can be transmitted in one subframe of the PUCCH.

Here, the mobile station apparatus 200 encodes the information indicating the ACK/NACK (for example, the information indicating the ACK/NACK whose number of bits is 1 to 20) by utilizing the SRMC or the DRMC. The mobile station apparatus 200 can transmit the information indicating the ACK/NACK encoded by utilizing the SRMC or the DRMC to the base station apparatus 100.

Further, in the case where it is necessary to transmit the first control information (for example, the scheduling request, the channel state information) other than the information indicating the ACK/NACK when transmitting the information indicating the ACK/NACK (for example, the information indicating the ACK/NACK whose number of bits is 1 to 20), the mobile station apparatus 200 encodes both the information indicating the ACK/NACK and the first control information other than the information indicating the ACK/NACK by utilizing the SRMC or the DRMC. The mobile station apparatus 200 can transmit both the information indicating the ACK/NACK and the first control information other than the information indicating the ACK/NACK encoded by utilizing the SRMC or the DRMC to the base station apparatus 100 in the same subframe.

Further, the base station apparatus 100 can allocate the PUCCH resource for the mobile station apparatus 200 to transmit the uplink control information (the information indicating the ACK/NACK, the first control information (for example, the scheduling request, the channel state information)). For example, the base station apparatus 100 can allocate the PUCCH resource for the mobile station apparatus 200 to transmit the uplink control information using the RRC signaling.

Further, for example, the base station apparatus 100 can allocate the PUCCH resource for the mobile station apparatus 200 to transmit the uplink control information in correspondence to the PDCCH.

Further, for example, the base station apparatus 100 can allocate the PUCCH resource to the mobile station apparatus 200 by configuring candidates of the PUCCH resource for the mobile station apparatus 200 to transmit the uplink control information (for example, four candidates of the PUCCH resource) by the RRC signaling and further by indicating one PUCCH resource from among the four PUCCH resource candidates using the information transmitted on the PDCCH (also called ARI: ACK/NACK Resource Indicator, UCI Resource Indicator).

Here, for example, the base station apparatus 100 can indicate one PUCCH resource from among the four PUCCH resource candidates using the information (ARI) transmitted on the PDCCH in the secondary cell. At this time, the mobile station apparatus 200 supposes that the same value is set to all the information (ARI) transmitted on the PDCCH in a plurality of secondary cells in the same subframe.

[Coding Scheme Utilizing (Single) Reed-Muller Code]

Figure 5A:
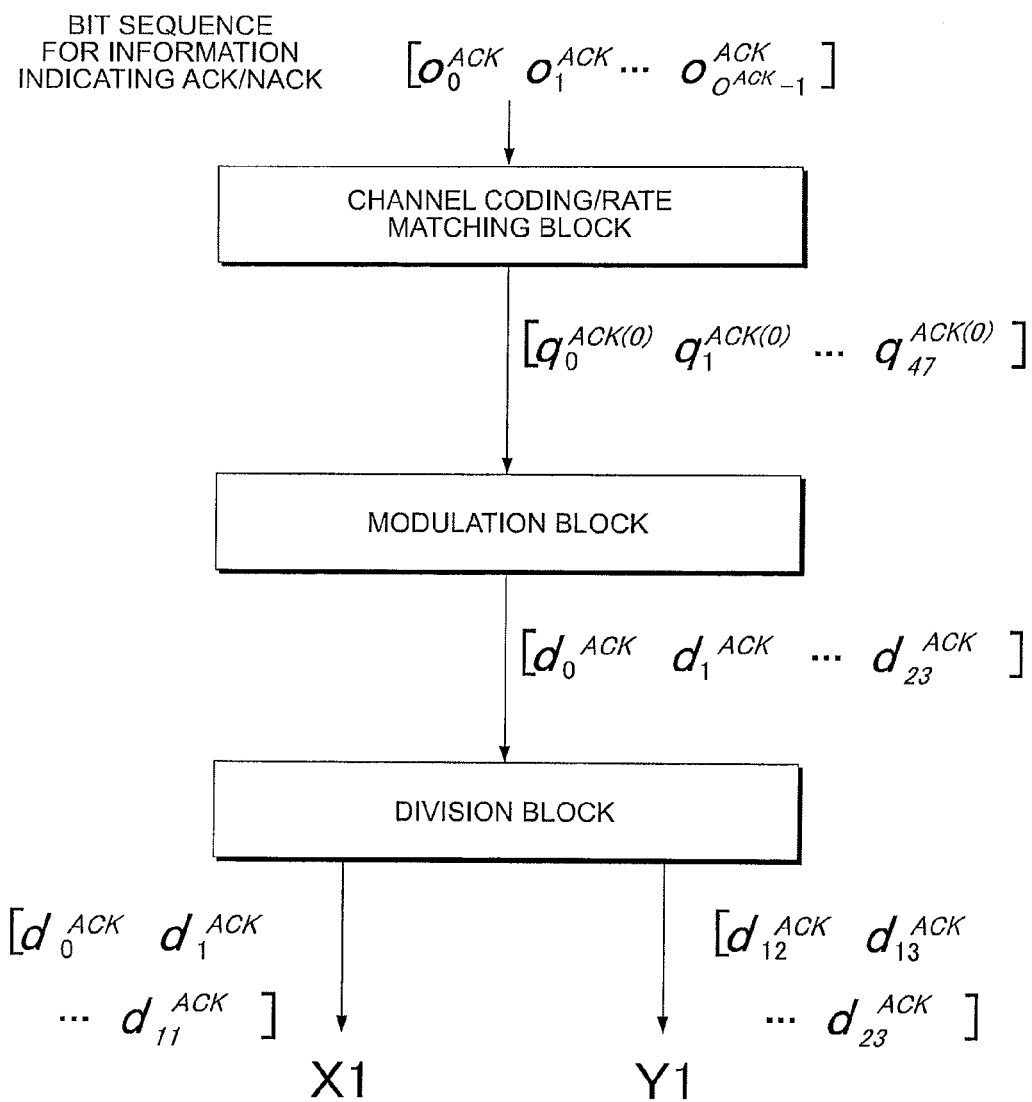
FIG. 5A is a diagram for explaining a coding scheme utilizing a single Reed-Muller code.
Figure 5B:
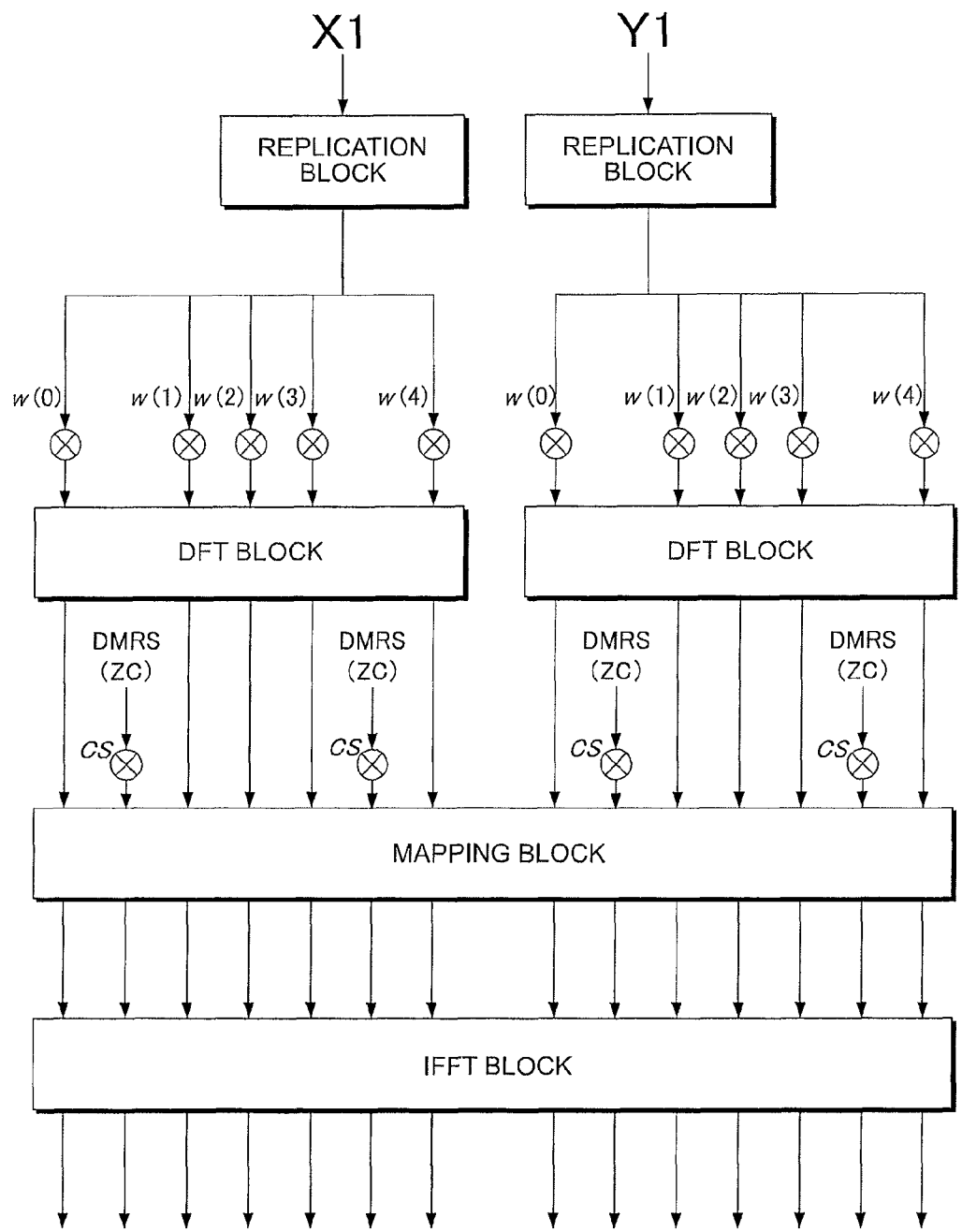
FIG. 5B is a diagram for explaining a coding scheme utilizing the single Reed-Muller code.

FIG. 5A and FIG. 5B are diagrams each showing an example of a coding scheme utilizing the (single) Reed-Muller code (SRMC) by the mobile station apparatus 200. In FIG. 5A and FIG. 5B, the mobile station apparatus 200 applies the coding utilizing the SRMC to the information indicating the ACK/NACK. For example, the mobile station apparatus 200 applies the coding utilizing the SRMC to the uplink control information in the transmission data modulation portion 202 shown above. In FIG. 5A and FIG. 5B, a bit sequence (bits) for the ACK/NACK to be input to the channel coding/rate matching block is denoted by $[o^{ACK}_0 \ o^{ACK}_1 \ldots o^{ACK}_{o^{ACK}-1}]$. Here, $o^{ACK}$ denotes the number of bits of the information indicating the ACK/NACK (which can also be said to be the number of information bits, the payload size, the amount of information, and the length of bit sequence).

First, for example, the bit sequence $[o^{ACK}_0 \ o^{ACK}_1 \ldots o^{ACK}_{o^{ACK}-1}]$ for the information indicating the ACK/NACK is encoded using a $(32, o^{ACK})$ block code, which is the Reed-Muller code. FIG. 6 shows an example of a code word of the $(32, o^{ACK})$ block code used for encoding and, for example, as a code word of the $(32, o^{ACK})$ block code, a linear combination of 11 base sequences denoted by $M_{i,n}$ is used. FIG. 6 shows an example of the base sequence for the $(32, o^{ACK})$ code.

For example, in FIG. 5A and FIG. 5B, the information indicating the ACK/NACK expressed by the bit sequence of 11 bits is input to the code word of the $(32, o^{ACK})$ block code and a 32-bit encoded block is output. Further, FIG. 5A and FIG. 5B show that a bit sequence of 48 bits $[q^{ACK(0)}_0 \ q^{ACK(0)}_1 \ldots q^{ACK(0)}_{47}]$ is output by circular repetition of the 32-bit encoded block in the channel coding/rate matching block. That is, the encoding utilizing the SRMC outputs the bit sequence of 48 bits by circular repetition, and therefore, it is made possible to make an attempt to maintain and improve quality by encoding. Here, for example, for the generation of the bit sequence $q^{ACK(0)}_i$, a calculation formula (1) below is used.

[Formula 1]

$$q_i^{ACK(0)} = \Sigma_{n=0}^{o^{ACK}-1}(o_n^{ACK} \cdot M_{(i \bmod 32),n}) \bmod 2,$$
$$(i=0, 1, \ldots, 47) \quad (1)$$

Further, in FIG. 5A and FIG. 5B, the bit sequence $[q^{ACK(0)}_0 \ q^{ACK(0)}_1 \ldots q^{ACK(0)}_{47}]$ output from the channel coding/rate matching block is modulated in the modulation block. FIG. 5A and FIG. 5B show, as an example, that the QPSK is performed on the bit sequence $[q^{ACK(0)}_0 \ q^{ACK(0)}_1 \ldots q^{ACK(0)}_{47}]$ in the modulation block and 24 blocks of complex-valued modulation symbol $[d^{ACK}_0 \ d^{ACK}_1 \ldots d^{ACK}_{23}]$ are output. Here, for example, the modulation multi-value number (the number of bits that can be transmitted in one subframe) of the QPSK is two, the modulation multi-value number of the 16QAM is four, and the modulation multi-value number of the 64QAM is six.

Further, in FIG. 5A and FIG. 5B, the blocks of complex-valued modulation symbol $[d^{ACK}_0 \ d^{ACK}_1 \ldots d^{ACK}_{23}]$ output from the modulation block are divided into the blocks of complex-valued modulation symbol $[d^{ACK}_0 \ d^{ACK}_1 \ldots d^{ACK}_{11}]$ and $[d^{ACK}_{12} \ d^{ACK}_{13} \ldots d^{ACK}_{23}]$. Here, for example, the divided block of complex-valued modulation symbol $[d^{ACK}_0 \ d^{ACK}_1 \ldots d^{ACK}_{11}]$ is mapped onto the first slot (first 0.5 ms) of one subframe (1 ms) and the block of complex-values modulation symbol $[d^{ACK}_{12} \ d^{ACK}_{13} \ldots d^{ACK}_{23}]$ is mapped onto the second slot (remaining 0.5 ms) of one subframe (1 ms).

Further, each of the blocks of complex-valued modulation symbol $[d^{ACK}_0 \ d^{ACK}_1 \ldots d^{ACK}_{11}]$ and $[d^{ACK}_{12} \ d^{ACK}_{13} \ldots d^{ACK}_{23}]$ output from each division block is replicated in a replication block and after each of the replicated blocks of complex-valued modulation symbol is orthogonalized by applying an orthogonal sequence (for example, $w(0)$, $w(1)$, $w(2)$, $w(3)$, $w(4)$) (after subjected to block wise spreading by $w(i)$), the DFT is performed in the DFT block.

Furthermore, the block of complex-valued modulation symbol output from the DFT block is mapped onto a radio resource (PUCCH resource) in the mapping block together with a DMRS (Demodulation Reference Symbol) orthogonalized by performing Cyclic Shift (CS) of the Zadoff-Chu (ZC) sequence, and IFFT processing is performed in the IFFT block.

[Coding Scheme Utilizing Dual Reed-Muller Code]

Figure 7B:
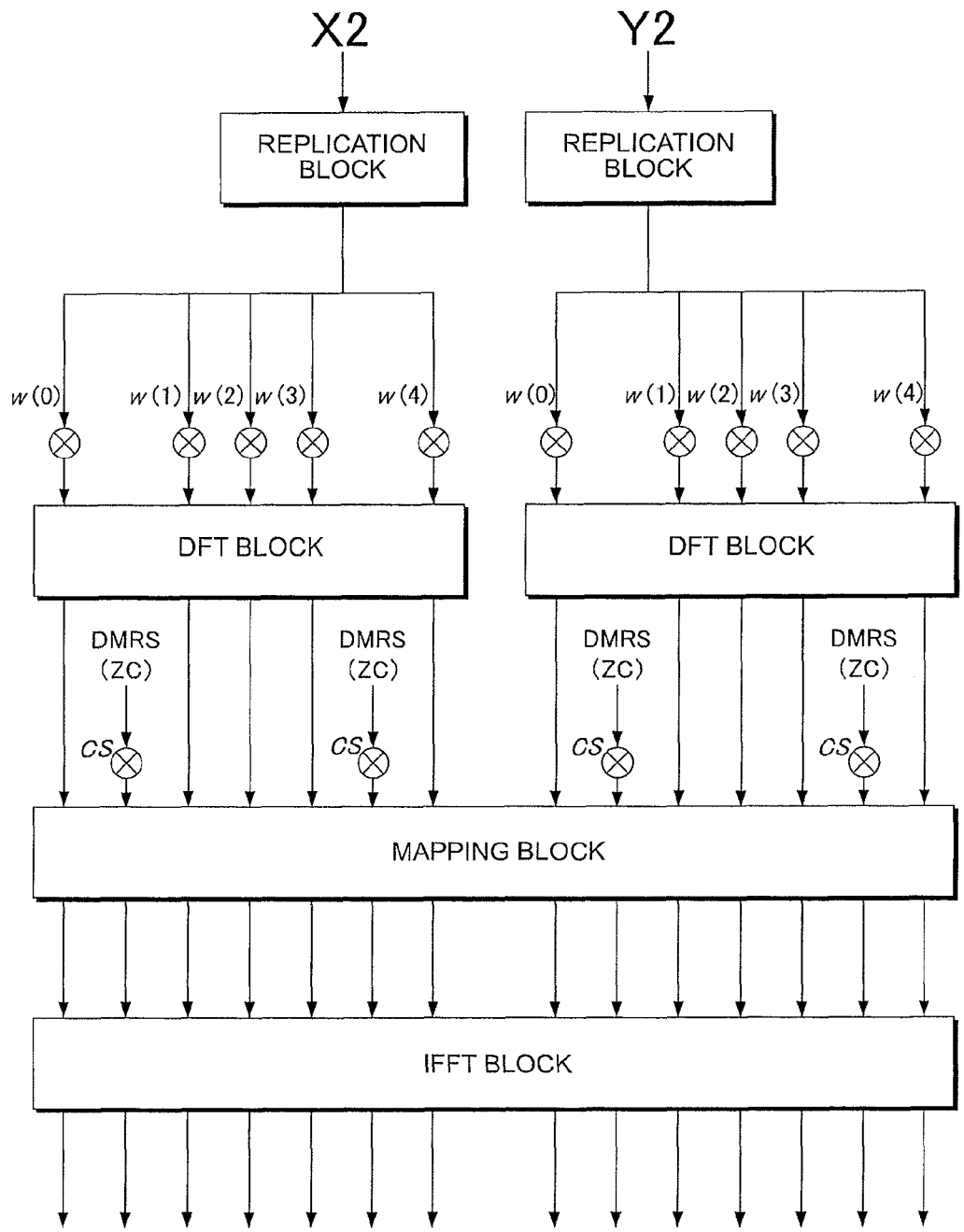
FIG. 7B is a diagram for explaining a coding scheme utilizing the dual Reed-Muller code.

FIG. 7A and FIG. 7B are diagrams each showing an example of the coding scheme utilizing the dual Reed-Muller code (DRMC) by the mobile station apparatus 200. In FIG. 7A and FIG. 7B, the mobile station apparatus 200 applies the coding utilizing the DRMC to the information indicating the ACK/NACK. For example, the mobile station apparatus 200 applies the coding utilizing the DRMC to the uplink control information in the transmission data modulation portion 202 shown above.

In FIG. 7A and FIG. 7B, the bit sequence (bits) for the ACK/NACK to be input to the division block is denoted by $[o^{ACK}_0 \ o^{ACK}_1 \ldots o^{ACK}_{o^{ACK}}ACK_{-1}]$. Here, $o^{ACK}$ denotes the number of bits of the information indicating the ACK/NACK (which can also be said to be the number of information bits, the payload size, the amount of information, or the length of bit sequence).

First, for example, the bit sequence $[o^{ACK}_0 \ o^{ACK}_1 \ldots o^{ACK}_{o}ACK_{-1}]$ for the information indicating the ACK/NACK is divided into bit sequences $[o^{ACK}_0 \ o^{ACK}_1 \ldots o^{ACK}_{[oACK/2]-1}]$ and $[o^{ACK}_{[oACK/2]} \ o^{ACK}_{[oACK/2]+1} \ldots o^{ACK}_{o}ACK_{-1}]$, respectively. Further, each of the divided bit sequences $[o^{ACK}_0 \ o^{ACK}_1 \ldots o^{ACK}_{[oACK/2]-1}]$ and $[o^{ACK}_{[oACK/2]} \ o^{ACK}_{[oACK/2]+1} \ldots o^{ACK}_{o}ACK_{-1}]$ is encoded using the $(32, o^{ACK})$ block code (using two Reed-Muller codes) in the channel coding/puncture block. Here, for example, as a code word of the $(32, o^{ACK})$ block code used for encoding, two linear combinations of 11 base sequences denoted by $M_{i,n}$ as shown in FIG. 6 are used. Further, for example, from each encoded block output from the $(32, o^{ACK})$ block code, the last eight bits are punctured and a 24-bit encoded block is output from the $(32, o^{ACK})$ block code, respectively.

For example, in FIG. 7A and FIG. 7B, the information indicating the ACK/NACK expressed by a bit sequence of 20 bits is divided into two bit sequences of 10 bits in the division block. Further, FIG. 7A and FIG. 7B show that in each channel coding/puncture block, a 32-bit encoded block is output from the bit sequence of 10 bits and by puncturing the last eight bits, the bit sequences $[q^{ACK(0)}_0 \ q^{ACK(0)}_1 \ldots q^{ACK(0)}_{23}]$ and $[q^{ACK(1)}_0 \ q^{ACK(1)}_1 \ldots q^{ACK(1)}_{23}]$ each having 24 bits are output. That is, the encoding utilizing the DRMC outputs the bit sequence each having 24 bits by puncturing the last eight bits, and therefore, compared to the encoding utilizing the SRMC, there is a possibility that the quality is degraded due to encoding. Here, for example, for the generation of the bit sequences $q^{ACK(0)}_i$ and $q^{ACK(1)}_i$, respectively, calculation formulas (2) and (3) below are used.

[Formula 2]

$$q_i^{ACK(0)} = \Sigma_{n=0}^{\lceil o^{ACK}/2 \rceil - 1}(o_n^{ACK} \cdot M_{(i \bmod 32),n}) \bmod 2,$$
$$(i = 0, 1, \ldots, 23) \quad (2)$$

[Formula 3]

$$q_i^{ACK(1)} = \Sigma_{n=\lceil o^{ACK}/2 \rceil}^{o^{ACK}-1}(o_n^{ACK} \cdot M_{(i \bmod 32),n}) \bmod 2,$$
$$(i = 0, 1, \ldots, 23) \quad (3)$$

Further, in FIG. 7A and FIG. 7B, the bit sequences $[q^{ACK(0)}_0 \ q^{ACK(0)}_1 \ldots q^{ACK(0)}_{23}]$ and $[q^{ACK(1)}_0 \ q^{ACK(1)}_1 \ldots q^{ACK(1)}_{23}]$ output from the channel coding/puncture block are interleaved and concatenated in an interleave/concatenation block. In FIG. 7A and FIG. 7B, the bit sequence of 48 bits output from the interleave/concatenation block is denoted by $[q^{ACK}_0 \ q^{ACK}_1 \ldots q^{ACK}_{47}]$.

Further, in FIG. 7A and FIG. 7B, the bit sequence of 48 bits $[q^{ACK}_0 \ q^{ACK}_1 \ldots q^{ACK}_{47}]$ output from the interleave/concatenation block is modulated in the modulation block. FIG. 7A and FIG. 7B show that, as an example, the QPSK is performed on the bit sequence $[q^{ACK}_0 \ q^{ACK}_1 \ldots q^{ACK}_{47}]$ in the modulation block and 24 blocks of complex-valued modulation symbol $[d^{ACK}_0 \ d^{ACK}_2 \ldots q^{ACK}_{23}]$ are output.

Further, in FIG. 7A and FIG. 7B, the block of complex-valued modulation symbol $[d^{ACK}_0 \ d^{ACK}_1 \ldots d^{ACK}_{23}]$ output from the modulation block is divided into the blocks of complex-valued modulation symbol $[d^{ACK}_0 \ d^{ACK}_1 \ldots d^{ACK}_{11}]$ and $[d^{ACK}_{12} \ d^{ACK}_{13} \ldots d^{ACK}_{23}]$ in the division block. Here, for example, the divided block of complex-valued modulation symbol $[d^{ACK}_0 \ d^{ACK}_1 \ldots d^{ACK}_{11}]$ is mapped onto the first slot (first 0.5 ms) of one subframe (1 ms) and the block of complex-valued modulation symbol $[d^{ACK}_{12} \ d^{ACK}_{13} \ldots d^{ACK}_{23}]$ is mapped onto the second slot (remaining 0.5 ms) of one subframe (1 ms).

Further, the blocks of complex-valued modulation symbol $[d^{ACK}_0 \ d^{ACK}_1 \ldots d^{ACK}_{11}]$ and $[d^{ACK}_{12} \ d^{ACK}_{13} \ldots d^{ACK}_{23}]$ output from each of the division blocks are replicated in the replication block and after each of the replicated blocks of complex-valued modulation symbol is orthogonalized by applying the orthogonal sequence (for example, w(0), w(1), w(2), w(3), w(4)) (after subjected to block wise spreading by w(i)), the DFT is performed in the DFT block.

Further, the block of complex-valued modulation symbol output from the DFT block is mapped onto a radio resource (PUCCH resource) in the mapping block together with the DMRS (Demodulation Reference Symbol) orthogonalized by performing Cyclic Shift (CS) of the Zadoff-Chu (ZC) sequence and IFFT processing is performed in the IFFT block.

First Embodiment

Next, a first embodiment in a mobile communication system using the base station apparatus 100 and the mobile station apparatus 200 is explained. In the first embodiment, the mobile station apparatus 200 can determine which of the coding scheme utilizing the DRMC and the coding scheme utilizing the SRMC to apply based on a first payload size when encoding the information indicating the ACK/NACK, and can also determine which of the coding scheme utilizing the DRMC and the coding scheme utilizing the SRMC to apply based on a second payload size when encoding both the information indicating the ACK/NACK and the first control information. Here, the first payload size and the second payload size are specified, respectively.

Further, the mobile station apparatus 200 determines which of the coding scheme utilizing the DRMC and the coding scheme utilizing the SRMC to apply based on the first payload size when encoding the information indicating the ACK/NACK, and determines which of the coding scheme utilizing the DRMC and the coding scheme utilizing the SRMC to apply based on the second payload size when encoding both the information indicating the ACK/NACK and the first control information. Here, the first payload size and the second payload size are different payload sizes.

Here, the first payload size includes the payload size of the information indicating the ACK/NACK. The second payload size includes the payload size of the information indicating the ACK/NACK. Further, the second payload size may include the sum of the payload size of the information indicating the ACK/NACK and the payload size of the first control information.

Further, the first payload size is determined by the base sequence of the RM code used for the encoding of the information indicating the ACK/NACK. The second payload size is determined by the base sequence of the RM code used for the encoding of the information indicating the ACK/NACK and the first control information.

Further, the mobile station apparatus 200 can switch between the coding scheme utilizing the DRMC and the coding scheme utilizing the SRMC with the payload size specified for each transmission according to whether to transmit the information indicating the ACK/NACK or to transmit both the information indicating the ACK/NACK and the first control information in a certain subframe.

Here, the first control information includes the scheduling request. Further, the first control information includes the channel state information. The uplink control information transmitted (or encoded) by the mobile station apparatus 200 as the uplink control information other than the information indicating the ACK/NACK is describe to be the first control information.

Figure 8:
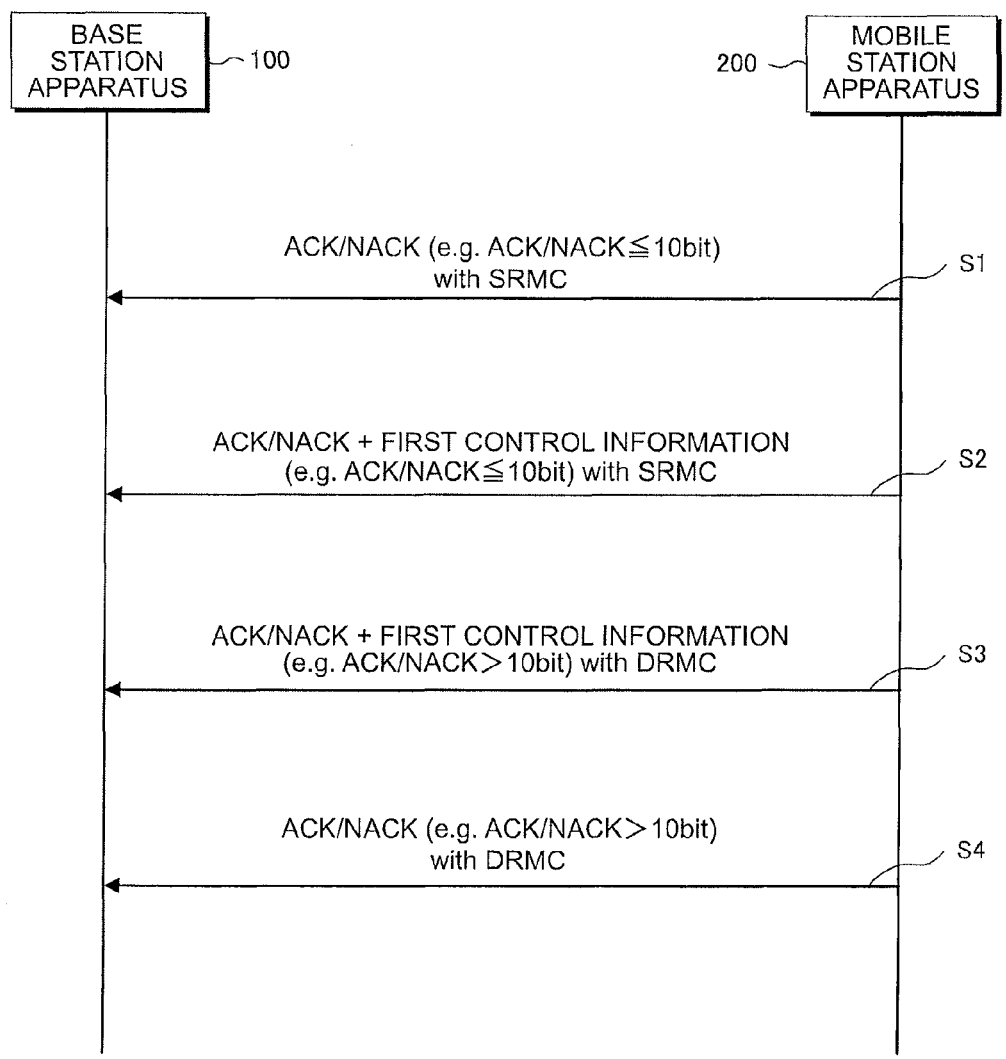
FIG. 8 is a diagram for explaining a first embodiment.

FIG. 8 is a sequence chart for explaining the first embodiment in the present invention. It is possible to apply the first embodiment to the base station apparatus 100 and the mobile station apparatus 200 in the mobile communication system that supports the cell aggregation as described above. Further, it is possible to apply the first embodiment to the base station apparatus 100 and the mobile station apparatus 200 that support the TDD and/or FDD.

In FIG. 8, the mobile station apparatus 200 can apply the coding scheme utilizing the SRMC to the information indicating the ACK/NACK when transmitting the information indicating the ACK/NACK to the base station apparatus 100 (S1: step 1). Further, the mobile station apparatus 200 can apply the coding scheme utilizing the SRMC to the information indicating the ACK/NACK and the first control information when transmitting both the information indicating the ACK/NACK and the first control information to the base station apparatus 100 in the same subframe (S2: step 2).

Further, the mobile station apparatus 200 can apply the coding scheme utilizing the DRMC to the information indicating the ACK/NACK and the first control information when transmitting both the information indicating the ACK/NACK and the first control information to the base station apparatus 100 in the same subframe (S3: step 3). Furthermore, the mobile station apparatus 200 can apply the coding scheme utilizing the DRMC to the information indicating the ACK/NACK when transmitting the information indicating the ACK/NACK to the base station apparatus 100 (S4: step 4).

In FIG. 8, the mobile station apparatus 200 can apply the coding scheme utilizing the SRMC to the information indicating the ACK/NACK when transmitting the information indicating the ACK/NACK to the base station apparatus 100 (S1: step 1). Further, the mobile station apparatus 200 can apply the coding scheme utilizing the DRMC to the information indicating the ACK/NACK when transmitting the information indicating the ACK/NACK to the base station apparatus 100 (S4: step 4).

Here, for example, in the case where the payload size (which can also be said to be the number of bits, the amount of information, or the bit sequence) of the information indicating the ACK/NACK is equal to or less than 10 bits (smaller than 11 bits), the mobile station apparatus 200 can apply the coding scheme utilizing the SRMC to the information indicating the ACK/NACK. That is, in the case where the payload size of the information indicating the ACK/NACK is equal to or less than N bits (a predetermined number of bits) (smaller than a predetermined number of bits), the mobile station apparatus 200 can apply the coding scheme utilizing the SRMC to the information indicating the ACK/NACK when encoding the information indicating the ACK/NACK.

Further, for example, in the case where the payload size of the information indicating the ACK/NACK is larger than 10 bits (equal to or more than 11 bits), the mobile station apparatus 200 can apply the coding scheme utilizing the DRMC to the information indicating the ACK/NACK. That is, in the case where the payload size of the information indicating the ACK/NACK is larger than the N bits (the predetermined number of bits) (equal to or more than a predetermined number of bits), the mobile station apparatus 200 can apply the coding scheme utilizing the DRMC to the information indicating the ACK/NACK when encoding the information indicating the ACK/NACK.

Here, it is determined, for example, by the base sequence of the RM code that is used for the encoding of the information indicating the ACK/NACK that when the payload size of the information indicating the ACK/NACK is what number of bits or less (what number of bits or more), the mobile station apparatus 200 applies the coding scheme utilizing the SMRC for the information indicating the ACK/NACK (applies the coding scheme utilizing the DRMC.)

Further, it is preliminarily specified, for example, by the specification or the like that when the payload size of the information indicating the ACK/NACK is what number of bits or less (what number of bits or more), the mobile station apparatus 200 applies the coding scheme utilizing the SMRC for the information indicating the ACK/NACK (applies the coding scheme utilizing the DRMC.)

For example, in the case where the base sequence of the RM code to which the bit sequence of 11 bits can be input as shown in FIG. 6 is used for the encoding of the information indicating the ACK/NACK, the mobile station apparatus 200 can apply the coding scheme utilizing the SRMC to the information indicating the ACK/NACK if the payload size of the information indicating the ACK/NACK is equal to or less than 10 bits.

Here, for example, in the case where the base sequence of the RM code to which the bit sequence of 11 bits can be input as shown in FIG. 6 is used for the encoding of the information indicating the ACK/NACK, the mobile station apparatus 200 may apply the coding scheme utilizing the SRMC to the information indicating the ACK/NACK if the payload size of the information indicating the ACK/NACK is equal to or less than 11 bits.

Further, for example, in the case where the base sequence of the RM code to which the bit sequence of 11 bits can be input as shown in FIG. 6 is used for the encoding of the information indicating the ACK/NACK, the mobile station apparatus 200 can apply the coding scheme utilizing the DRMC to the information indicating the ACK/NACK if the payload size of the information indicating the ACK/NACK is larger than 10 bits.

Here, for example, in the case where the base sequence of the RM code to which the bit sequence of 11 bits can be input as shown in FIG. 6 is used for the coding of the information indicating the ACK/NACK, the mobile station apparatus 200 may apply the coding scheme utilizing the DRMC to the information indicating the ACK/NACK if the payload size of the information indicating the ACK/NACK is larger than 11 bits.

That is, in the case where the base sequence of the RM code to which the bit sequence of N bits can be input is used for the encoding of the information indicating the ACK/NACK, the mobile station apparatus 200 can apply the coding scheme utilizing the SRMC to the information indicating the ACK/NACK if the bit sequence for the information indicating the ACK/NACK has bits equal to or less than (N−1) bits.

Further, in the case where the base sequence of the RM code to which the bit sequence of N bits can be input is used for the encoding of the information indicating the ACK/NACK, the mobile station apparatus 200 may apply the coding scheme utilizing the SRMC to the information indicating the ACK/NACK if the bit sequence for the information indicating the ACK/NACK has bits equal to or less than N bits.

Further, in the case where the base sequence of the RM code to which the bit sequence of N bits can be input is used for the encoding of the information indicating the ACK/NACK, the mobile station apparatus 200 applies the coding scheme utilizing the DRMC to the information indicating the ACK/NACK if the bit sequence for the information indicating the ACK/NACK has bits more than (N−1) bits.

Furthermore, in the case where the base sequence of the RM code to which the bit sequence of N bits can be input is used for the encoding of the information indicating the ACK/NACK, the mobile station apparatus 200 may apply the coding scheme utilizing the DRMC to the information indicating the ACK/NACK if the bit sequence for the information indicating the ACK/NACK has bits more than N bits.

Further, in FIG. 8, the mobile station apparatus 200 can apply the coding scheme utilizing the SRMC to the information indicating the ACK/NACK and the first control information when transmitting both the information indicating the ACK/NACK and the first control information to the base station apparatus 100 in the same subframe (S2: step 2). Further, the mobile station apparatus 200 can apply the coding scheme utilizing the DRMC to the information indicating the ACK/NACK and the first control information when transmitting both the information indicating the ACK/NACK and the first control information to the base station apparatus 100 in the same subframe (S3: step 3).

Here, for example, the mobile station apparatus 200 may transmit the information set to "1" to request the base station apparatus 100 to perform scheduling ("1" is set to the information field in which information indicating the scheduling request defined preliminarily is mapped) and transmit the information set to "0" in other cases (for example, in the case where scheduling is not requested) ("0" is set to the information field in which information indicating the scheduling request defined preliminarily is mapped).

That is, the mobile station apparatus 200 may transmit the information (the information bit, the information field) set to "1" (the information indicating the scheduling request) or set to "0" (the information indicating other states) together with the information indicating the ACK/NACK. In the following, it is assumed that the scheduling request that the mobile station apparatus 200 transmits to the base station apparatus 100 is expressed by one-bit information basically.

Further, for example, the mobile station apparatus 200 may transmit both the information indicating the ACK/NACK and the channel state information for reporting the channel state information for the downlink to the base station apparatus 100, the channel quality indicator, the precoding matrix indicator, or the rank indicator.

Here, for example, in the case where the payload size (which can also be said to be the number of bits, the amount of information, or the bit sequence) of the information indicating the ACK/NACK is equal to or less than 10 bits (smaller than 11 bits), the mobile station apparatus 200 can apply the coding scheme utilizing the SRMC to the information indicating the ACK/NACK and the first control information. That is, in the case where the payload size of the information indicating the ACK/NACK is equal to or less than M bits (a predetermined number of bits) (smaller than a predetermined number of bits), the mobile station apparatus 200 can apply the coding scheme utilizing the SRMC to the information indicating the ACK/NACK and the first control information when encoding the information indicating the ACK/NACK and the first control information.

Further, for example, in the case where the payload size of the information indicating the ACK/NACK is larger than 10 bits (11 bits or more), the mobile station apparatus 200 can apply the coding scheme utilizing the DRMC to the information indicating the ACK/NACK and the first control information. That is, in the case where the payload size of the information indicating the ACK/NACK is larger than M bits (a predetermined number of bits) (a predetermined number of bits or more), the mobile station apparatus 200 can apply the coding scheme utilizing the DRMC to the information indicating the ACK/NACK and the first control information when encoding the information indicating the ACK/NACK and the first control information.

Further, for example, in the case where the sum of the payload size of the information indicating the ACK/NACK and the payload size of the first control information is equal to or less than 11 bits (smaller than 12 bits), the mobile station apparatus 200 may apply the coding scheme utilizing the SRMC to the information indicating the ACK/NACK and the first control information. That is, in the case where the sum of the payload size of the information indicating the ACK/NACK and the payload size of the first control information is equal to or less than L bits (a predetermined number of bits) (smaller than a predetermined number of bits), the mobile station apparatus 200 may apply the coding scheme utilizing the SRMC to the information indicating the ACK/NACK and the first control information when encoding the information indicating the ACK/NACK and the first control information.

Further, for example, in the case where the sum of the payload size of the information indicating the ACK/NACK and the payload size of the first control information is larger than 11 bits (12 bits or more), the mobile station apparatus 200 may apply the coding scheme utilizing the DRMC to the information indicating the ACK/NACK and the first control information. That is, in the case where the sum of the payload size of the information indicating the ACK/NACK and the payload size of the first control information is larger than L bits (a predetermined number of bits) (a predetermined number of bits or more), the mobile station apparatus 200 may apply the coding scheme utilizing the DRMC to the information indicating the ACK/NACK and the first control information when encoding the information indicating the ACK/NACK and the first control information.

That is, the mobile station apparatus 200 can determine which of the coding scheme utilizing the SRMC and the coding scheme utilizing the DRMC to apply when encoding the information indicating the ACK/NACK and the first control information based on only the payload size of the information indicating the ACK/NACK.

Further, the mobile station apparatus 200 may determine which of the coding scheme utilizing the SRMC and the coding scheme utilizing the DRMC to apply when encoding the information indicating the ACK/NACK and the first control information based on the sum of the payload size of the information indicating the ACK/NACK and the payload size of the first control information.

Further, the mobile station apparatus 200 does not determine which of the coding scheme utilizing the SRMC and the coding scheme utilizing the DRMC when encoding the information indicating the ACK/NACK and the first control information based on only the payload size of the first control information (not dependent only on the payload size of the first control information).

Here, it is determined, for example, by the base sequence of the RM code that is used for the encoding of the information indicating the ACK/NACK and the first control information that when the payload size of the information indicating the ACK/NACK is what number of bits or less (what number of bits or more), the mobile station apparatus 200 applies the coding scheme utilizing the SMRC (or applies the coding scheme utilizing the DRMC) for the information indicating the ACK/NACK and the first control information.

Further, it may be preliminarily specified, for example, by the specification or the like that when the payload size of the information indicating the ACK/NACK is what number of bits or less (what number of bits or more), the mobile station apparatus 200 applies the coding scheme utilizing the SMRC (or applies the coding scheme utilizing the DRMC) for the information indicating the ACK/NACK and the first control information.

Further, it is determined, for example, by the base sequence of the RM code that is used for the coding of the information indicating the ACK/NACK and the first control information that when the sum of the payload size of the information indicating the ACK/NACK and the payload size of the first control information is what number of bits or less (what number of bits or more), the mobile station apparatus 200 applies the coding scheme utilizing the SMRC (or applies the coding scheme utilizing the DRMC) for the information indicating the ACK/NACK and the first control information.

Further, it may be preliminarily specified, for example, by the specification or the like that when the sum of the payload size of the information indicating the ACK/NACK and the payload size of the first control information is what number of bits or less (what number of bits or more), the mobile station apparatus 200 applies the coding scheme utilizing the SMRC (or applies the coding scheme utilizing the DRMC) for the information indicating the ACK/NACK and the first control information.

That is, the payload size (the payload size of the information indicating the ACK/NACK) for the mobile station apparatus 200 to determine which of the coding scheme utilizing the DRMC and the coding scheme utilizing the SRMC to apply when transmitting (only) the information indicating the ACK/NACK is preliminarily specified by the specifications or the like.

Further, the payload size (the payload size of the information indicating the ACK/NACK, or the sum of the payload size of the information indicating the ACK/NACK and the payload size of the first control information) for the mobile station apparatus 200 to determine which of the coding scheme utilizing the DRMC and the coding scheme utilizing the SRMC to apply when transmitting both the information indicating the ACK/NACK and the first control information is preliminarily specified by the specifications and the like.

The mobile station apparatus 200 switches between the coding scheme utilizing the DRMC and the coding scheme utilizing the SRMC with the payload size specified respectively (independently) by the specifications and the like based on the situations of the uplink control information to be transmitted in a certain subframe (whether to transmit (only) the information indicating the ACK/NACK or to transmit both the information indicating the ACK/NACK and the first control information).

That is, the mobile station apparatus 200 can determine which of the coding scheme utilizing the DRMC and the coding scheme utilizing the SRMC to apply based on (only) the payload size of the information indicating the ACK/NACK when transmitting (only) the information indicating the ACK/NACK in a certain subframe, and can also determine which of the coding scheme utilizing the DRMC and the coding scheme utilizing the SRMC to apply based on the sum of the payload size of the information indicating the ACK/NACK and the payload size of the first control information when transmitting both the information indicating the ACK/NACK and the first control information.

Here, the base station apparatus 100 may configure the payload size of the information indicating the ACK/NACK (or may also be the parameter relating to or information on the payload of the information indicating the ACK/NACK) using the RRC signaling in order for the mobile station apparatus 200 to determine which of the coding scheme utilizing the DRMC and the coding scheme utilizing the SRMC to apply when coding (only) the information indicating the ACK/NACK in a certain subframe.

Further, the base station apparatus 100 may configure the payload size of the information indicating the ACK/NACK (or may also be the parameter relating to or information on the payload of the information indicating the ACK/NACK) using the RRC signaling in order for the mobile station apparatus 200 to determine which of the coding scheme utilizing the DRMC and the coding scheme utilizing the SRMC to apply when encoding both the information indicating the ACK/NACK and the first control information in a certain subframe.

Further, the base station apparatus 100 may configure the sum of the payload size of the information indicating the ACK/NACK and the payload size of the first control information (or may also be the parameter relating to or information on the sum of the payload size of the information indicating the ACK/NACK and the payload size of the first control information) using the RRC signaling in order for the mobile station apparatus 200 to determine which of the coding scheme utilizing the DRMC and the coding scheme utilizing the SRMC to apply when encoding both the information indicating the ACK/NACK and the first control information in a certain subframe.

For example, in the case where the base sequence of the RM code to which the bit sequence of 11 bits can be input as shown in FIG. 6 is used for the encoding of the information indicating the ACK/NACK and the first control information, the mobile station apparatus 200 applies the coding scheme utilizing the SRMC to the information indicating the ACK/NACK and the first control information if the payload size of the information indicating the ACK/NACK is equal to or less than 10 bits.

Further, for example, in the case where the base sequence of the RM code to which the bit sequence of 11 bits can be input as shown in FIG. 6 is used for the encoding of the information indicating the ACK/NACK and the first control information, the mobile station apparatus 200 applies the coding scheme utilizing the DRMC to the information indicating the ACK/NACK and the first control information if the payload size of the information indicating the ACK/NACK is larger than 10 bits.

Further, for example, in the case where the base sequence of the RM code to which the bit sequence of 11 bits can be input as shown in FIG. 6 is used for the encoding of the information indicating the ACK/NACK and the first control information, the mobile station apparatus 200 may apply the coding scheme utilizing the SRMC to the information indicating the ACK/NACK and the first control information if the sum of the payload size of the information indicating the ACK/NACK and the payload size of the first control information is equal to or less than 11 bits.

Further, for example, in the case where the base sequence of the RM code to which the bit sequence of 11 bits can be input as shown in FIG. 6 is used for the encoding of the information indicating the ACK/NACK and the first control information, the mobile station apparatus 200 may apply the coding scheme utilizing the DRMC to the information indicating the ACK/NACK and the first control information if the sum of the payload size of the information indicating the ACK/NACK and the payload size of the first control information is larger than 11 bits.

That is, in the case where the base sequence of the RM code to which the bit sequence of N bits can be input is used for the encoding of the information indicating the ACK/NACK and the first control information, the mobile station apparatus 200 applies the coding scheme utilizing the SRMC to the information indicating the ACK/NACK and the first control information if the bit sequence for the information indicating the ACK/NACK has bits equal to or less than (N−1) bits.

Further, in the case where the base sequence of the RM code to which the bit sequence of N bits can be input is used for the encoding of the information indicating the ACK/NACK and the first control information, the mobile station apparatus 200 applies the coding scheme utilizing the DRMC to the information indicating the ACK/NACK and the first control information if the bit sequence for the information indicating the ACK/NACK has bits more than (N−1) bits.

Further, in the case where the base sequence of the RM code to which the bit sequence of N bits can be input is used for the encoding of the information indicating the ACK/NACK and the first control information, the mobile station apparatus 200 may apply the coding scheme utilizing the SRMC to the information indicating the ACK/NACK and the first control information if the sum of the bits of the bit sequence for the information indicating the ACK/NACK and the bits of the bit sequence for the first control information is equal to or less than N bits.

Further, in the case where the base sequence of the RM code to which the bit sequence of N bits can be input is used for the encoding of the information indicating the ACK/NACK and the first control information, the mobile station apparatus 200 may apply the coding scheme utilizing the DRMC to the information indicating the ACK/NACK and the first control information if the sum of the bits of the bit sequence for the information indicating the ACK/NACK and the bits of the bit sequence for the first control information is larger than N bits.

As described above, the mobile station apparatus 200 can determine the number of bits of the information indicating the ACK/NACK (which can also be said to be the payload size, the amount of information, or the length of bit sequence) to be transmitted to the base station apparatus 100 by the serving cells (the number of serving cells) and the downlink transmission mode in each serving cell. Here, the serving cells and the downlink transmission mode in each serving cell are configured by the base station apparatus 100. Further, the mobile station apparatus 200 can determine the number of bits of the information indicating the ACK/NACK (which can also be said to be the payload size, the amount of information, or the length of bit sequence) to be transmitted to the base station apparatus 100 by the correspondence (TDD configuration) between the downlink subframe and the uplink subframe configured by the base station apparatus 100. That is, the mobile station apparatus 200 can determine the number of bits of the information indicating the ACK/NACK based on the number of downlink subframes corresponding to the information indicating the ACK/NACK to be transmitted in a certain uplink subframe.

In the following, it is assumed that the information indicating the ACK/NACK for one transport block to be transmitted by the base station apparatus (the information indicating the ACK/NACK corresponding to one code word) is expressed by one bit basically. Further, it is also assumed that the first control information is expressed by one bit.

That is, in the case where the downlink transmission mode in which the transmission of the PDSCH to which the MIMO is applied (the transmission of up to two transport blocks) is performed in a certain serving cell is configured by the base station apparatus 100, the information indicating the ACK/NACK is expressed by two bits. Further, it is assumed that the base station apparatus 100 and the mobile station apparatus 200 transmit and receive the transport blocks in all the configured serving cells in all the four subframes by utilizing the TDD. Furthermore, it is also assumed that the mobile station apparatus 200 uses the base sequence of the RM code to which the bit sequence of 11 bits can be input as shown in FIG. 6 when encoding the information indicating the ACK/NACK and/or the first control information.

That is, as described above, for example, in the case where the payload size of the information indicating the ACK/NACK is equal to or less than 10 bits, the mobile station apparatus 200 applies the coding scheme utilizing the SRMC to the information indicating the ACK/NACK when encoding the information indicating the ACK/NACK. Further, in the case where the payload size of the information indicating the ACK/NACK is larger than 10 bits, the mobile station apparatus 200 applies the coding scheme utilizing the DRMC to the information indicating the ACK/NACK.

Further, as described above, for example, in the case where the sum of the payload size of the information indicating the ACK/NACK and the payload size of the first control information is equal to or less than 11 bits, the mobile station apparatus 200 applies the coding scheme utilizing the SRMC to the information indicating the ACK/NACK and the first control information when encoding both the information indicating the ACK/NACK and the first control information. Furthermore, in the case where the sum of the payload size of the information indicating the ACK/NACK and the payload size of the first control information is larger than 11 bits, the mobile station apparatus 200 applies the coding scheme utilizing the DRMC to the information indicating the ACK/NACK.

For example, in the case where two serving cells are configured and the transmission of the PDSCH using the single antenna port mode (the transmission of one transport block) is configured as the downlink transmission mode for each serving cell by the base station apparatus 100, the mobile station apparatus 200 transmits the information indicating the ACK/NACK of eight bits (2×1×4) to the base station apparatus 100.

That is, in this configuration, the mobile station apparatus 200 applies the coding scheme utilizing the SRMC to the information indicating the ACK/NACK when encoding the information indicating the ACK/NACK. Further, in this configuration, the mobile station apparatus 200 applies the coding scheme utilizing the SRMC to the information indicating the ACK/NACK and the first control information when encoding both the information indicating the ACK/NACK and the first control information. That is, the mobile station apparatus 200 encodes the information indicating the ACK/NACK of eight bits and the first control information of one bit by utilizing the SRMC and transmits them to the base station apparatus 100.

Further, for example, in the case where two serving cells are configured and the transmission of the PDSCH using the multiple antenna ports mode (the transmission of up to two transport blocks) is configured as the downlink transmission mode for each serving cell by the base station apparatus 100, the mobile station apparatus 200 transmits the information indicating the ACK/NACK of 16 bits (2×2×4).

That is, in this configuration, the mobile station apparatus 200 applies the coding scheme utilizing the DRMC to the information indicating the ACK/NACK when encoding the information indicating the ACK/NACK. Further, in this configuration, the mobile station apparatus 200 applies the coding scheme utilizing the DRMC to the information indicating the ACK/NACK and the first control information when encoding both the information indicating the ACK/NACK and the first control information. That is, the mobile station apparatus 200 encodes the information indicating the ACK/NACK of 16 bits and the first control information of one bit by utilizing the DRMC and transmits them to the base station apparatus 100.

Further, for example, in the case where three serving cells are configured and the transmission of the PDSCH using the multiple antenna ports mode (the transmission of up to two transport blocks) is configured as the downlink transmission mode for each serving cell by the base station apparatus 100, the mobile station apparatus 200 compresses the information indicating the ACK/NACK of 24 bits (3×2×4) into the information indicating the ACK/NACK of 12 bits (3×(2/2)× 4) by utilizing the spatial bundling. As described above, the mobile station apparatus 200 can compress the number of bits of the information indicating the ACK/NACK by utilizing the spatial bundling in the case where the number of bits of the information indicating the ACK/NACK exceeds a predetermined value (for example, 20 bits). The mobile station apparatus 200 transmits the compressed information indicating the ACK/NACK of 12 bits to the base station apparatus 100.

That is, in this configuration, the mobile station apparatus 200 applies the coding scheme utilizing the DRMC to the information indicating the ACK/NACK when encoding the information indicating the ACK/NACK. That is, the mobile station apparatus 200 encodes the information indicating the ACK/NACK of 12 bits compressed by utilizing the spatial bundling by utilizing the DRMC and transmits it to the base station apparatus 100.

Further, in this configuration, the mobile station apparatus 200 applies the coding scheme utilizing the DRMC to the information indicating the ACK/NACK and the first control information when encoding both the information indicating the ACK/NACK and the first control information. That is, the mobile station apparatus 200 encodes the information indicating the ACK/NACK of 12 bits compressed by utilizing the spatial bundling and the first control information of one bit by utilizing the DRMC and transmits them to the base station apparatus 100.

That is, the mobile station apparatus 200 can determine which of the coding scheme utilizing the SRMC and the coding scheme utilizing the DRMC to apply when encoding the information indicating the ACK/NACK based on the payload size of the information indicating the ACK/NACK compressed by utilizing the spatial bundling (it is possible to determine based on only the payload size of the information indicating the ACK/NACK after the spatial bundling).

Further, the mobile station apparatus 200 can determine which of the coding scheme utilizing the SRMC and the coding scheme utilizing the DRMC to apply when encoding the information indicating the ACK/NACK and the first control information based on the payload size of the information indicating the ACK/NACK compressed by utilizing the spatial bundling (it is possible to determine based on only the payload size of the information indicating the ACK/NACK after the spatial bundling).

Further, the mobile station apparatus 200 can determine which of the coding scheme utilizing the SRMC and the coding scheme utilizing the DRMC to apply when encoding the information indicating the ACK/NACK and the first control information based on the sum of the payload size of the information indicating the ACK/NACK compressed by utilizing the spatial bundling and the payload size of the first control information (it is possible to determine based on the sum of the payload size of the information indicating the ACK/NACK after the spatial bundling and the payload size of the first control information).

Further, the mobile station apparatus 200 can determine which of the coding scheme utilizing the SRMC and the coding scheme utilizing the DRMC to apply when encoding the information indicating the ACK/NACK based on the serving cells (the number of serving cells) and the downlink transmission mode in each serving cell. Here, the serving cells and the downlink transmission mode in each serving cell are configured by the base station apparatus 100.

Further, the mobile station apparatus 200 can determine which of the coding scheme utilizing the SRMC and the coding scheme utilizing the DRMC to apply when encoding the information indicating the ACK/NACK and the first control information based on the serving cells (the number of serving cells) and the downlink transmission mode in each serving cell. Here, the serving cells and the downlink transmission mode in each serving cell are configured by the base station apparatus 100.

Further, the mobile station apparatus 200 can determine which of the coding scheme utilizing the SRMC and the coding scheme utilizing the DRMC to apply when encoding the information indicating the ACK/NACK and the first control information based on the correspondence (TDD configuration) between the downlink subframe and the uplink subframe configured by the base station apparatus 100. That is, the mobile station apparatus 200 can determine which of the coding scheme utilizing the SRMC and the coding scheme utilizing the DRMC to apply when encoding the information indicating the ACK/NACK and the first control information based on the number of downlink subframes corresponding to the information indicating the ACK/NACK to be transmitted in a certain uplink subframe.

Here, the mobile station apparatus 200, in which the transmission of the information indicating the ACK/NACK and the transmission of the first control information would occur in the same subframe, can use a calculation formula (4) below, for example, in order to generate the bit sequence $q^{ACK(0)}_i$ when applying the coding scheme utilizing the SRMC.

[Formula 4]

$$q_i^{ACK(0)} = \Sigma_{n=0}^{o^{ACK}}(o_n^{ACK} \cdot M_{(i \bmod 32),n}) \bmod 2,$$
$$(i=0, 1, \ldots, 47), (o_{oACK}^{ACK} = o^{UCI}) \quad (4)$$

Here, in the calculation formula (4), the first control information is denoted as UCI. That is, for example, in the case where the mobile station apparatus 200 applies the coding scheme utilizing the SRMC to the information indicating the ACK/NACK and the first control information, the bit sequence for the first control information is concatenated to the end (to the end part) of the bit sequence for the information indicating the ACK/NACK. That is, the mobile station apparatus 200 encodes the bit sequence obtained by concatenating the bits of the information indicating the ACK/NACK and the bit (s) of the first control information. Here, as described above, for example, the mobile station apparatus 200 uses the calculation formula (1) in order to generate the bit sequence $q^{ACK(0)}_i$ when transmitting (only) the information indicating the ACK/NACK.

Similarly, the mobile station apparatus 200, in which the transmission of the information indicating the ACK/NACK and the transmission of the first control information would occur in the same subframe, can use calculation formulas (5) and (6) below, for example, in order to generate the bit sequences $q^{ACK(0)}_i$ and $q^{ACK(1)}_i$, respectively, when applying the coding scheme utilizing the DRMC.

[Formula 5]

$$q_i^{ACK(0)} = \Sigma_{n=0}^{[o^{ACK}/2]-1}(o_n^{ACK} \cdot M_{(i \bmod 32),n}) \bmod 2,$$
$$(i=0, 1, \ldots, 23) \quad (5)$$

[Formula 6]

$$q_i^{ACK(1)} = \Sigma_{n=[o^{ACK}/2]}^{o^{ACK}}(o_n^{ACK} \cdot M_{(i \bmod 32),n}) \bmod 2,$$
$$(i=0, 1, \ldots, 23), (o_{oACK}^{ACK} = o^{UCI}) \quad (6)$$

Here, in the calculation formulas (5) and (6), the first control information is denoted as UCI. That is, for example, in the case where the mobile station apparatus 200 applies the coding scheme utilizing the DRMC to the information indicating the ACK/NACK and the first control information, the bit sequence for the first control information is concatenated to the end (to the end part) of the bit sequence for the information indicating the ACK/NACK. Further, the bit sequence for the first control information is input to only one of the two Reed-Muller codes. For example, the bit sequence for the first control information is concatenated to the shorter one of the bit sequences for the information indicating the ACK/NACK (the payload whose payload size of the information indicating the ACK/NACK is smaller). That is, the mobile station apparatus 200 separately encodes the bit sequences which are obtained by concatenating the bits of the information indicating the ACK/NACK and the bit (s) of the first control information to generate a bit sequence and by dividing the generated bit sequence. Here, as described above, for example, the mobile station apparatus 200 uses the calculation formulas (2) and (3) in order to generate the bit sequences $q^{ACK(0)}{}_i$ and $q^{ACK(1)}{}_i$, respectively, when transmitting (only) the information indicating the ACK/NACK.

As described above, it is possible to efficiently switch between the coding scheme utilizing the SRMC and the coding scheme utilizing the DRMC applied by the mobile station apparatus 200 by specifying the payload sizes separately (independently) for the information indicating the ACK/NACK, and the information indicating the ACK/NACK and the first control information, respectively, in order for the mobile station apparatus 200 to determine which of the coding scheme utilizing the DRMC and the coding scheme utilizing the SRMC to apply when encoding the information indicating the ACK/NACK and/or the first control information.

Further, as described above, it is made possible for the mobile station apparatus 200 to appropriately combine the compression of the number of bits by the spatial bundling and the coding scheme (the coding scheme utilizing the SRMC or the coding scheme utilizing the DRMC) by using the payload size of the information indicating the ACK/NACK after the application of the spatial bundling when encoding the information indicating the ACK/NACK and/or the first control information.

Further, the mobile station apparatus 200 can switch between the coding scheme utilizing the SRMC and the coding scheme utilizing the DRMC based on the specified payload size of the information indicating the ACK/NACK when transmitting (only) the information indicating the ACK/NACK to the base station apparatus 100.

Further, the mobile station apparatus 200 can switch between the coding scheme utilizing the SRMC and the coding scheme utilizing the DRMC based on the specified payload size of the information indicating the ACK/NACK when transmitting both the information indicating the ACK/NACK and the first control information to the base station apparatus 100.

Further, the mobile station apparatus 200 can switch between the coding scheme utilizing the SRMC and the coding scheme utilizing the DRMC based on the sum of the specified payload size of the information indicating the ACK/NACK and the payload size of the first control information when transmitting both the information indicating the ACK/NACK and the first control information to the base station apparatus 100.

In the present embodiment, it is mainly described that the mobile station apparatus 200 encodes the uplink control information (the information indicating the ACK/NACK, the scheduling request, the channel state information) using the base sequence of the RM code to which the bit sequence of 11 bits can be input. However, it is obvious that the same embodiment can also be applied even in the case where the mobile station apparatus 200 uses a base sequence of the RM code to which any number of bits can be input.

The embodiment explained above is also applied to the integrated circuit mounted on the base station apparatus 100 and the mobile station apparatus 200. Further, in the embodiment explained above, it can also be possible to control the base station apparatus 100 and the mobile station apparatus 200 by recording programs to implement each function of the base station apparatus 100 and each function of the mobile station apparatus 200 to a computer-readable recording medium and causing a computer system to read and execute the programs recorded in the recording medium. It is assumed that the "computer system" referred to here includes an OS and hardware, such as a peripheral.

Further, the "computer-readable recording medium" refers to a storage device, such as a portable medium such as a flexible disc, a magneto-optical disc, a ROM, and a CD-ROM, and a hard disc incorporated in the computer system. Further, it is supposed that the "computer-readable recording medium" includes those which dynamically hold programs for a brief time, such as a communication line in the case where programs are transmitted via a network, such as the Internet, and a communication circuit line, such as a telephone circuit line, and those which hold programs for a fixed period of time, such as a nonvolatile memory within the computer system, which serves as a server or client in the above case. The above-mentioned programs can be those which implement part of the functions described previously, or may be those that can be implemented by combining the functions described previously and the programs already recorded in the computer system.

As above, the embodiment of the invention is described in detail with reference to the drawings, but, specific configurations are not limited to the embodiment and designs etc. in the scope not deviating from the gist of the present invention are also included in the scope of claims.

DESCRIPTION OF SYMBOLS

100 base station apparatus
101 data control portion
102 transmission data modulation portion
103 radio portion
104 scheduling portion
105 channel estimation portion
106 reception data demodulation portion
107 data extraction portion
108 higher layer
109 antenna
110 radio resource control portion
200, 200-1 to 200-3 mobile station apparatus
201 data control portion
202 transmission data modulation portion
203 radio portion
204 scheduling portion
205 channel estimation portion
206 reception data demodulation portion
207 data extraction portion
208 higher layer
209 antenna
210 radio resource control portion

The invention claimed is:

1. A mobile station apparatus comprising:
a receiving circuitry configured to and/or programmed to receive, from a base station apparatus, a radio resource control signal including first information used for configuring four physical uplink control channel resources, wherein
the receiving circuitry is configured to and/or programmed to receive on a physical downlink control channel, from the base station apparatus, second information used for indicating one physical uplink control channel resource, the one physical uplink control channel resource being among the four physical uplink control channel resources; and
a transmitting circuitry configured to and/or programmed to transmit in a subframe, to the base station apparatus, only Hybrid Automatic Repeat Request (HARQ) control information on the indicated one physical uplink control channel resource, only the HARQ control information being transmitted using one of a first processing method of coding and a second processing method of coding, the one of the first processing method of coding and the second processing method of coding being applied on the basis of whether a number of bits of only the HARQ control information exceeds a first predetermined value, wherein
the transmitting circuitry is configured to and/or programmed to transmit in a subframe, to the base station apparatus, HARQ control information and channel state information on the indicated one physical uplink control channel resource, the HARQ control information and the channel state information being transmitted using one of the first processing method of coding and the second processing method of coding, the one of the first processing method of coding and the second processing method of coding being applied on the basis of whether a sum of a number of bits of the HARQ control information and a number of bits of the channel state information exceeds a second predetermined value.

2. The mobile station apparatus according to claim 1, wherein
the HARQ control information is information indicating a positive acknowledgment or a negative acknowledgment.

3. A base station apparatus comprising:
a transmitting circuitry configured to and/or programmed to transmit, to a mobile station apparatus, a radio resource control signal including first information used for configuring four physical uplink control channel resources, wherein
the transmitting circuitry is configured to and/or programmed to transmit on a physical downlink control channel, to the mobile station apparatus, second information used for indicating one physical uplink control channel resource, the one physical uplink control channel resource being among the four physical uplink control channel resources; and
a receiving circuitry configured to and/or programmed to receive in a subframe, from the mobile station apparatus, only Hybrid Automatic Repeat Request (HARQ) control information on the indicated one physical uplink control channel resource, only the HARQ control information being received using one of a first processing method of coding and a second processing method of coding, the one of the first processing method of coding and the second processing method of coding being applied on the basis of whether a number of bits of only the HARQ control information exceeds a first predetermined value, wherein
the receiving circuitry is configured to and/or programmed to receive in a subframe, from the mobile station apparatus, HARQ control information and channel state information on the indicated one physical uplink control channel resource, the HARQ control information and the channel state information being received using one of the first processing method of coding and the second processing method of coding, the one of the first processing method of coding and the second processing method of coding being applied on the basis of whether a sum of a number of bits of the HARQ control information and a number of bits of the channel state information exceeds a second predetermined value.

4. The base station apparatus according to claim 3, wherein
the HARQ control information is information indicating a positive acknowledgment or a negative acknowledgment.

5. A communication method of a mobile station apparatus, the communication method comprising:
receiving, from a base station apparatus, a radio resource control signal including first information used for configuring four physical uplink control channel resources,
receiving on a physical downlink control channel, from the base station apparatus, second information used for indicating one physical uplink control channel resource, the one physical uplink control channel resource being among the four physical uplink control channel resources,
transmitting in a subframe, to the base station apparatus, only Hybrid Automatic Repeat Request (HARQ) control information on the indicated one physical uplink control channel resource, only the HARQ control information being transmitted using one of a first processing method of coding and a second processing method of coding, the one of the first processing method of coding and the second processing method of coding being applied on the basis of whether a number of bits of only the HARQ control information exceeds a first predetermined value, and
transmitting in a subframe, to the base station apparatus, HARQ control information and channel state information on the indicated one physical uplink control channel resource, the HARQ control information and the channel state information being transmitted using one of the first processing method of coding and the second processing method of coding, the one of the first processing method of coding and the second processing method of coding being applied on the basis of whether a sum of a number of bits of the HARQ control information and a number of bits of the channel state information exceeds a second predetermined value.

6. A communication method of a base station apparatus, the communication method comprising:
transmitting, to a mobile station apparatus, a radio resource control signal including first information used for configuring four physical uplink control channel resources,
transmitting on a physical downlink control channel, to the mobile station apparatus, second information used for indicating one physical uplink control channel resource, the one physical uplink control channel resource being among the four physical uplink control channel resources, receiving in a subframe, from the mobile station apparatus, only Hybrid Automatic Repeat Request (HARQ) control information on the indicated one physical uplink control channel resource, only the HARQ control information being received using one of a first processing method of coding and a second processing method of coding, the one of the first processing method of coding and the second processing method of coding being applied on the basis of whether a number of bits of only the HARQ control information exceeds a first predetermined value, and receiving in a subframe, from the mobile station apparatus, HARQ control information and channel state information on the indicated one physical uplink control channel resource, the HARQ control information and the channel state information being received using one of the first processing method of coding and the second processing method of coding, the one of the first processing method of coding and the second processing method of coding being applied on the basis of whether a sum of a number of bits of the HARQ control information and a number of bits of the channel state information exceeds a second predetermined value.

* * * * *